United States Patent [19]

Yasuda et al.

[11] Patent Number: 5,625,181
[45] Date of Patent: Apr. 29, 1997

[54] LIGHT-RECEIPT SYSTEM WITH CURRENT BIAS CIRCUIT AND PRE-AMPLIFIER FOR USE IN OPTICAL DIGITAL COMMUNICATION

[75] Inventors: Akihiko Yasuda; Setsuo Misaizu; Hisaya Sakamoto, all of Yokohama; Yuji Miyaki, Kawasaki; Norio Nagase, Kawasaki; Hiroshi Kuzukami, Kawasaki, all of Japan

[73] Assignee: Fujitsu Limited, Kanagawa, Japan

[21] Appl. No.: 288,582

[22] Filed: Aug. 10, 1994

[30] Foreign Application Priority Data

Jan. 12, 1994 [JP] Japan ................................. 6-014785
Jul. 5, 1994 [JP] Japan ................................. 6-153245

[51] Int. Cl.⁶ .......................... H04B 10/06; H03G 3/20
[52] U.S. Cl. .......................... 250/214 A; 250/214 AG; 250/214 C; 359/174; 359/189
[58] Field of Search .................... 250/214 A, 214 AZ, 250/214 LS, 214 R, 214 AG, 214 C; 359/174, 175, 176, 177, 189, 190, 194

[56] References Cited

U.S. PATENT DOCUMENTS

| | | | |
|---|---|---|---|
| 4,750,217 | 6/1988 | Smith et al. | 250/214 A |
| 4,764,732 | 8/1988 | Dion | 250/214 A |
| 5,293,260 | 3/1994 | Kikawa et al. | 359/177 |
| 5,311,353 | 5/1994 | Crawford | 359/333 |
| 5,363,064 | 11/1994 | Mikamura | 330/308 |

FOREIGN PATENT DOCUMENTS

| | | |
|---|---|---|
| 56-21381 | 2/1981 | Japan . |
| 57-207448 | 12/1982 | Japan . |
| 60-79839 | 5/1985 | Japan . |
| 6422122 | 1/1989 | Japan . |

*Primary Examiner*—Edward P. Westin
*Assistant Examiner*—John R. Lee

[57] ABSTRACT

A light receipt system has a bias circuit and a light-receipt element. The bias circuit controls light input power to the light-receipt element to the optimum multiplication factor. The bias circuit of the light-receipt element has a first resistor, a second resistor, and a third resistor. The first resistor and the second resistor are connected in parallel, and the light-receipt element is connected between a connection of the first resistor and the second resistor, and the third resistor. A bypass current path is provided, connected to a junction point between the first resistor and the second resistor.

22 Claims, 26 Drawing Sheets

Temperature Inclination of $V_1$ = Temperature Inclination of D

Ambient temperature $T_a$

FIG. 6

| | (I) | (II) | (III) |
|---|---|---|---|
| Circuit (a) | | Capacity equalization | Composed Capacity Value Order |
| | | | $10^{-14}$ |
| Circuit (b) | | | $10^{-13}$ |

LIGHT-RECEIPT SYSTEM WITH CURRENT BIAS CIRCUIT AND PRE-AMPLIFIER FOR USE IN OPTICAL DIGITAL COMMUNICATION

BACKGROUND OF THE INVENTION

1. Field of the Invention

The present invention relates to a light-receipt system for use in optical digital communication having a light-receipt element, such as avalanche photo diode.

More particularly, it relates to a light-receipt system having a bias circuit, which can be controlled to have an optimum multiplication factor ($M_{OPT}$), and which can realize to stably operate detecting the disconnection of a light input.

2. Related Art

According to that high speed and wide-band communication has been widely desired in recent year, optical digital communication has been used extensively. A general structure of a light-receipt system, that is used for the optical digital communication is as shown in the functional block diagram illustrated in FIG. 27.

It is general that an avalanche photo diode is used as a light-receipt element in the light-receipt system. In FIG. 27, reference numeral "10" is an avalanche photo diode (hereinafter, referred to as APD).

The bias current of the APD 10 is controlled by a bias control circuit 11. When a receipt light is inputted to the APD 10, the corresponding current flows as an electrical signal, and the current is converted to a voltage for leading to a preamplifier 12.

The electrical signal amplified in the preamplifier 12 is led to an identifying and reproducing and clock extracting circuit 14, via an equalizing amplifier 13. An identified and reproduced data DATA and an extracted clock CLK are outputted from the identifying and reproducing and clock extracting circuit 14.

On the other hand, an output of the equalizing amplifier 13 is also inputted to the peak detecting section 15, and the output of the equalizing amplifier 13 detected in the peak detecting section 15 is compared with a predetermined reference value in a comparator 16. In the case where the peak value of the output of the equalizing amplifier 13 is smaller than the predetermined reference value, the light input is judged as disconnected.

It is further desired in the light-receipt system, to have a wide dynamic range, especially, for the light input, and to operate detecting the disconnection of the light input, stably.

The former problem of the wide dynamic range for the light input is caused by saturation of the above-described preamplifier 12, deterioration of the APD operative range, and more particularly, the influence in the multiplication factor M at the minimum light input level and the maximum light input level.

Further, the latter problem that the light input disconnection can not be detected is caused because an amplifier having a high gain has to be mounted according to the demand for making the system compact. These problems will be further considered in detail as follows.

FIG. 28 is an example showing the circuit of transimpedance type preamplifier employed as an preamplifier 12. In FIG. 28, a transistor TR1 and a transistor TR2 are connected in the form of cascade, a diode D1 and a resistor R2 are connected with an emitter circuit of the transistor TR2 in series, and an output voltage $V_{OUT}$ is outputted from the emitter of the transmitter TR2.

Further, a feed back resistor Rf is connected from the cathode of the diode D1 to the base side of the transistor TR1.

FIG. 29 is a characteristic chart of an input current versus an output voltage, indicating the relation between the input current $I_{IN}$ of the preamplifier 12, which is the output of the APD 10 and the output voltage $V_{OUT}$ of the preamplifier 12. Further, if the relation between the input current $I_{IN}$ and the output voltage $V_{OUT}$ will be considered referring to FIG. 28, it will be expressed as the following formulas.

$$V_1 = V_{BE(TR1)} \tag{1}$$

$$V_2 = V_1 - I_{IN} \times R_f \tag{2}$$

$$V_{OUT} = V_2 + V_{D1} \tag{3}$$

From these formulas (1) through (3), $$V_{OUT} = V_1 - I_{IN} \times R_f + V_{D1} \tag{4}$$

Further, in the above-described formula, $V_{ee}$=0 V to make the formula simple.

Hereupon, when the input level becomes larger according as $I_{IN}$ becomes larger, the current would not flow to the diode D1 and the resistor R2, so that the relation becomes $V_{OUT} = V_{D1}$.

Accordingly, the input current $I_{IN(MAX)}$ at the time the relation becomes $V_{OUT} = V_{D1}$ is called as input saturation current and expressed as the following formula.

$$I_{IN(MAX)} = V_1 / R_f \tag{5}$$

Further, the collector potential of the transistor TR1 is reversed to the base potential, and the transistor TR1 is saturated, because it becomes $V_2$=0 and the current source of the transistor TR2 and the diode D1 are lost, when the relation becomes $I_{IN} > I_{IN(MAX)}$.

Then, the characteristic of the input and the output becomes as shown in FIG. 29. A point P shows a saturation point in the diagram. When the transistor TR1 is saturated, it does not return to the feedback condition, until the charge accumulated in the parasitic capacity between the base and collector was fully discharged, even if the relation becomes $I_{IN} < I_{IN(MAX)}$.

Accordingly, the deterioration of the waveform response as the input and output waveform shown in FIG. 30 causes symbol error. That is, in FIG. 30, (1) shows a waveform of the input current $I_{IN}$, and (2) and (3) are waveforms of the output voltage $V_{OUT}$.

On the relation of the input and output between (1) and (2), the input current $I_{IN}$ (1) is small. The input light level is small according as the input current $I_{IN}$ (1) is small, so that the waveform of the output voltage $V_{OUT}$ (2) is not deteriorated, and thus the judging of the symbol can be performed correctly.

On the other hand, in the case of (3) in FIG. 30, it is a waveform of the output voltage $V_{OUT}$ in the case where the input light level is large and the input current $I_{IN}$ is close to the input saturation current $I_{IN(MAX)}$. In this case, the waveform is not returned to 0, and deteriorated by the saturation of the transistor TR1, until the charge accumulated in the parasitic capacity located between the base and collector was fully discharged, described above.

Accordingly, in this case, the symbol error in judging is caused, if it is identified at the time shown with the broken line in FIG. 30. Therefore, the saturation current $I_{IN(MAX)}$ is improved, when the $V_1$ is made larger or the $R_f$ is made smaller, according to the formula (5). However, it is difficult to change the inside circuit, in the case where the circuit element (IC) commercially available in the market is used.

The above-described problem occurs in the case where the input current $I_{IN}$ of the preamplifier 12 is maximum, that is, the light dynamic range is at the maximum light-receipt level. On the other hand, the following problem occurs at the time the light dynamic range is at the minimum light-receipt level, as well.

FIGS. 31 and 32 are structural diagrams used as the prior art of the APD bias control circuit of the light-receipt system shown in FIG. 28. FIG. 31 is a diagram explaining a predetermined bias system which is one example of the conventional bias system.

In FIG. 31, reference numeral "10" is an avalanche photo diode (APD), and reference numeral "11" is a circuit for generating a predetermined bias voltage used as a bias control circuit. Further, reference numeral "12" is a preamplifier, of which output is led to an equalized amplifier 13 and the like connected backward, as shown in FIG. 28.

This is a basic bias circuit, however, the characteristic is deteriorated largely according to the variability of temperature and power, and the dispersion of avalanche photo diode, when the receipt-light power is minimum. And there is no control of gain of the APD, that is, a multiplication factor M, because it is a predetermined bias system, so that the light input dynamic range is narrow.

Thus, it is general to use the bias system having an AGC loop as shown in FIG. 32. FIG. 32 is a structural example of light-receipt system using the conventional bias system having the FULL-AGC loop, in contrast to a structural example of the general light-receipt system explained according to FIG. 27.

In FIG. 32, the light input signal is outputted after converting to the electrical signal by the APD 10. This output is led to the equalizing amplifier 13 via a preamplifier 12. And the waveform of the output is equalized in the equalizing amplifier 13 and led to the peak voltage detector 7.

The peak of the signal is detected in the peak voltage detector 7, and inputted to a bias circuit 11 constituted of a DC-DC convertor, via the amplifier 8. The size of bias is varied, corresponding to the peak detection signal to be inputted in the bias circuit 11. Hereby, the peak value of the output of the equalizing amplifier 13 is controlled so as to be constant.

Further, the output of the equalizing amplifier 13 is inputted to the identifying and reproducing circuit 14, and the data and clock are reproduced in this circuit 14. And it is also led to the timing extracting circuit 141, the timing signal is extracted in this circuit 141, and led to a light input disconnection detecting circuit.

The light input disconnection detecting circuit having a peak voltage detecting section 15 and a comparator 16 detects the state of the disconnection of the light input by detecting that the timing signal is disconnected for a given interval.

There is a problem on the above-described conventional bias circuit and system, as follows. Further, the problem will be explained referring to FIGS. 33 and 34. FIG. 33 is a diagram showing the relation between the conventional bias control system, that is, a multiplication factor control system, and the optimum multiplication factor.

In FIG. 33, the axis of abscissas shows a light input power, and the axis of ordinates shows the multiplication factor M. "$P_{MIN}$" means a minimum light input power. Further, the characteristic of the optimum multiplication factor is shown with "$M_{OPT}$".

As is apparent from this diagram, the multiplication factor M is predetermined in the predetermined bias system shown in FIG. 31 (it is shown as the M-predetermined system in FIG. 33), and the multiplication factor M is always large for the characteristic of the optimum multiplication factor $M_{OPT}$, so that the output is deteriorated by the saturation of the avalanche photo diode, at the time the light-receipt power is maximum.

On the other hand, the multiplication factor M becomes smaller as the light input power becomes larger, unlike the predetermined bias system, in the case of the bias system having FULL-AGC loop shown in FIG. 32. This is because the output amplitude of the equalizing amplifier 13 is controlled so as to be constant by an AGC feedback loop.

Hereupon, FIG. 34 showing the relation between the conventional APD output signal current and noise and the multiplication factor will be observed. In FIG. 34, the axis of abscissas shows the value of the multiplication factor M, and the axis of ordinates shows the APD output signal current i and the noise N.

The characteristic $M_{OPT}$ of the optimum multiplication factor is settled in the position where S/N ratio is the best, when the shot noise is minimum and the signal is maximum, as ② shown in FIG. 34.

In the case of the bias system having the FULL-AGC loop, the multiplication factor M becomes smaller, corresponding to the increase of the light input, as the output signal current of the avalanche photo diode APD is controlled so as to be constant, even if the light input is increased as shown in ① of FIG. 34 (FIG. 34 ③).

Then, the shot noise becomes larger as shown in ④. However, the increase of the shot noise is smaller than that of the signal, and the input reduced noise becomes dominant. That is, in the case where the light input signal is made larger from the state of the optimum multiplication factor $M_{OPT}$, the output current S of the avalanche photo diode APD and the noise N are constant, and the S/N ratio also becomes constant, so that error rate is predetermined (floor), without improving.

On the other hand, in the case of the fixed bias system, although both the output current S of the avalanche photo diode APD and the noise S become larger, according as the light input is made larger, the floor is not generated as the S/N is improved, because the noise N is increased with square root.

From the viewpoint of that, it is difficult to perform detection of the disconnection of the light input from the output current of the avalanche photo diode APD, in the case of the bias system having the FULL-AGC loop. That is, the bias current $I_{APD}$ of the avalanche photo diode is in the number μA order, so that it is difficult to perform the detection of the light input disconnection by the variability, as the change of $V_{APD}$ bias is small, because the inclination of the characteristic of $I_{APD}$-$V_{APD}$ is sharp.

Therefore, the light input disconnection detecting circuit for performing the detection of the disconnection of the timing signal is required, so that the circuit becomes complex.

Further, the response characteristic of the FULL-AGC loop is very slow and the circuit becomes complex, so that the problem upon which it is not easy to determine the time constant appears.

Accordingly, it is preferable to use the self-bias system. FIG. 35 shows a structure of the self-bias system.

As shown in FIG. 35, self-bias control resistors R1 and R2 are connected to the APD 10 in series, and the multiplication factor M is controlled by the self bias system. The relation between the light input power $P_{IN}$ in this case and the bias voltage $V_{APD}$ of the APD 10 in this case becomes as follows.

$$I_{APD} = (e \cdot \lambda \cdot \eta) \div (h \cdot c) \times M \times P_{IN} \tag{6}$$

$$M = 1/[1-(V_{APD}/V_B)^n] \tag{7}$$

$$V_{APD} = V_0 - (R1+R2) \times I_{APD} \tag{8}$$

Provided that $I_{APD}$: an average current of the APD 10, e: electron charge, $\lambda$: input wavelength, h: Plank's constant, c: speed of light, $\eta$: quantum efficiency of the APD 10, M: multiplication factor of the APD 10, $P_{IN}$: average light input power, $V_{APD}$: bias voltage of the APD 10, $V_B$: breakdown voltage of the APD 10, $V_0$: self-bias control voltage, R1 and R2: self-bias control resistors and n: index number of the APD multiplication factor determined by elements.

From the formula (8), the bias voltage $V_{APD}$ is reduced as shown in FIG. 36, according as the $I_{APD}$ at the maximum light-receipt level is increased. The frequency band is reduced as shown in FIG. 37, when this $V_{APD}$ is smaller than the band deteriorated voltage determined by elements, and becomes 10 MHz at the maximum light-receipt level.

Therefore, an error according to an intersymbol interference is generated in the input signal. As the resistance values of the resistors R1 and R2 are made smaller to keep the band of the APD, by making the value of the $V_{APD}$ larger, the multiplication factor M becomes larger according to the above-described formula (7), and the $I_{APD}$ is increased. Thus, this brings a problem that the light input level becomes lower to saturate and the preamplifier 12 connected backward to make the dynamic range of the preamplifier 12 narrower.

Hereupon, the above-described light input disconnection detecting circuit composed of the above-described peak detecting section 15 and a comparing amplifier 16 will be further considered. The peak detecting section 15 realizes to detect the disconnection of the light input by detecting the peak of the output of the equalizing amplifier 13.

In FIG. 38 for showing the output waveform characteristic of the equalizer with respect to the $P_{IN}$, $V_{P1}$ and $V_{P2}$ have the input level of the preamplifier 12, that is, the size corresponding to the light-receipt level of the APD 10. $V_{P1}$ shows the minimum light-receipt level (1), and $V_{P2}$ shows the level at the time the light input is disconnected.

The difference between the input signals $V_{P1}$ and $V_{P2}$ is minute, so that the difference of the peak voltage enough to be able to detect the disconnection of the light input in the comparator 16 can not be obtained without making the gain of the amplifier connected backward or the equalizing amplifier 13 large enough.

On the other hand, the light-receipt system is required to make compact, so that it brings the following problems, in the case where the amplifier having high gain is mounted to solve the above-described problem.

At first, the oscillation according to the leak in the light-receipt system is generated. That is, it brings a problem that the disconnection of the light input can not be detected because of providing the impedance between the power source pattern ($V_{CC}$, $V_{ee}$) and the ground (the case ground) and generating the oscillation due to the leak between the input and output of the amplifier having a high gain.

At second, the oscillation is generated at the time the light-receipt system is mounted to a mother board. That is, it brings the problem that the capacitance according to the interval space between the bottom of the light-receipt system and the signal and power source pattern of the mother board near the system, and the inductance component of interface ground pins connecting the light-receipt system to the ground form a resonant circuit, and the amplifier having a high gain is oscillated with the resonant frequency of the resonant circuit.

SUMMARY OF THE INVENTION

Accordingly, it is an object of the present invention to provide a light-receipt system having an APD bias circuit which can detect the disconnection of the light input signal, correctly.

It is another object of the present invention to provide a light-receipt system for realizing to operate making the dynamic range widely in the digital communication, and detecting the disconnection of the light input, stably.

Further, to be concretely, it is still another object of the present invention to provide a light-receipt system for solving a problem that a preamplifier is saturated at the time the light dynamic range is at the maximum light-input level.

It is a further object of the present invention to provide a light-receipt system for solving a problem that the frequency band of the APD is deteriorated at the maximum light-receipt level of the light dynamic range, so that the symbol error is generated on the input signal according to an intersymbol interference.

It is a still further object of the present invention to provide a light-receipt system for solving a problem that the dynamic range becomes narrow according as the light input level for saturating the preamplifier is lowered due to the deterioration of the APD frequency band in the self-bias system of the APD.

It is a still another object of the present invention to provide a light-receipt system for preventing from oscillating according to the leak in the light receipt system, and oscillating at the time the light-receipt system is mounted to a mother board in the case where an amplifier having a high gain is used to detect the disconnection of the light input signal, correctly.

A light-receipt system according to the present invention comprises a series circuit of a bias resistor and a light-receipt element, a preamplifier for converting a current corresponding to the light input level connected to the series circuit and detected by the light-receipt element to a voltage, an equalizing amplifier for equalizing and amplifying the output of the preamplifier, an identifying and reproducing circuit for identifying the output of the equalizing amplifier and using the output as the data output, and a light input disconnection detecting circuit for detecting the peak value of the output of the equalizing amplifier and detecting the disconnection of the light input according to the detected peak value.

And it is constituted so as to provide the resistor having a resistance value which is larger than the input impedance of the preamplifier between the input of the preamplifier and the ground potential, and flow the bias current to the resistor and increase the input saturation current of the preamplifier.

And further, the range where the bias voltage of the receipt light element at the maximum light input level should be controlled according to the dispersion characteristic of the self-bias control voltage per the light-receipt elements is determined and the bias resistor is controlled so as to be within the setting range.

The present invention is further constituted to have a series circuit composed of a first and second resistors connected to the ground and a light-receipt element and a current path through which a bypass current flows for controlling a current flowing to the series circuit so as that the potential of the junction point between the first resistor and the second resistor becomes a determined value.

Accordingly, the multiplication factor M of the avalanche photo diode APD can be controlled by using the voltage down generated by the bias current of the avalanche photo diode APD which varies corresponding to the light-input power with the first and the second resistors.

Further, voltage breakdown is generated by the first resistor according to controlling the bypass current flowing to the bypass current path, so that the potential of the junction point between the first and second resistors becomes variable. Thus, the self bias of the bias voltage $V_{APD}$ of the avalanche photo diode APD can be controlled.

Furthermore, the light-receipt system according to the present invention having a conductive case of the light receipt system which is a reference ground potential, and a print substrate providing at least the preamplifier and the equalizing amplifier arranged one behind another, wherein the case of the light receipt system provides multiple pins having conductivity which rises from the bottom surface, and the ground pattern is connected to the multiple pins having conductivity in parallel on the print substrate, when the ground pattern is formed between the input and output of the preamplifier and the equalizing amplifier which ranged one and another, and stored in the case of the light-receipt system.

Accordingly, inductor and capacity formed in the leak current which made feedback, or ground pattern and the reference ground pattern can be prevented from forming, or can be reduced, via the ground pattern, so that the amplifier can be prevented from oscillating.

Further objects of the present invention will become apparent during the course of the following detailed explanation and the description of claims attached to the specification.

BRIEF DESCRIPTION OF THE DRAWINGS

FIG. 6 is an explanatory diagram of the parasitic capacity.

DETAILED DESCRIPTION OF THE PREFERRED EMBODIMENTS

Figure 1:
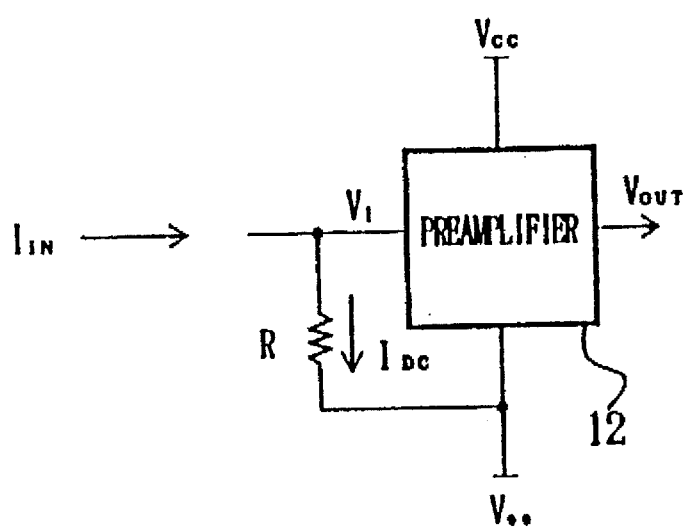
FIG. 1 is a block diagram showing one example to improve a saturation current of a preamplifier according to the present invention.

The embodiments will be explained according to the attached drawings, as follow. Identical reference numerals or symbols will be used to designate identical or corresponding positions, throughout the following descriptions of the present invention.

[Improvement of the maximum light input level in the light dynamic range]

Figure 2:
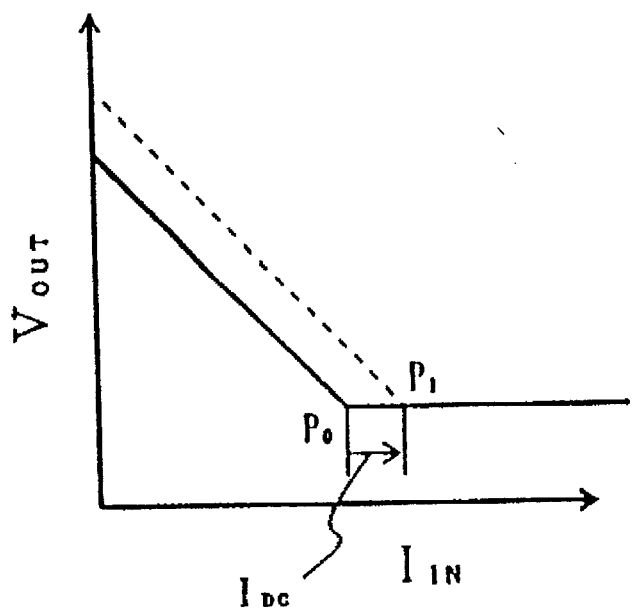
FIG. 2 is a diagram showing a characteristic of an input current and an output voltage embodying an operation shown in FIG. 1.
Figure 29:
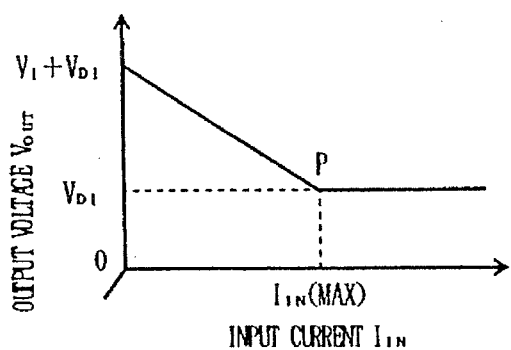
FIG. 29 is a diagram showing a characteristic of an input current and an output voltage shown in FIG. 28.
Figure 30:
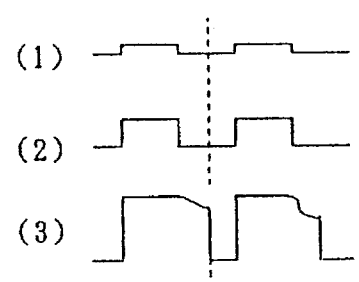
FIG. 30 is a diagram showing the input and output waveform showing in FIG. 28.
Figure 31:
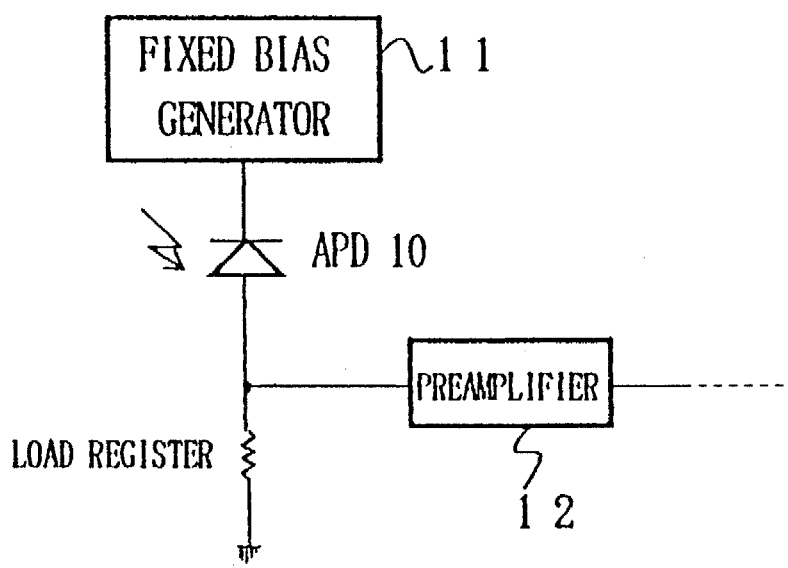
FIG. 31 is a diagram for explaining one structural example of the conventional bias system.

FIG. 1 illustrates one embodiment according to the present invention for improving characteristic deterioration due to the saturation of a preamplifier 12 at the maximum light input level. FIG. 2 is a diagram showing an input current to output voltage characteristic of a preamplifier 12 shown in the diagram of FIG. 1, in comparison with the conventional characteristic shown in FIG. 29.

In FIG. 1, reference numeral "12" is an preamplifier explained in FIGS. 27 through 32. A resistor R which is enough larger than an input impedance of the preamplifier 12 is provided between the input and the ground, and flows the current bias $I_{DC}$ in the direction where the input current $I_{IN}$ is reduced. Accordingly, the input current to output voltage characteristic shown with the solid line is shifted to the characteristic shown with the broken line, so that the saturation point $P_0$ is also shifted to $P_1$, as shown in FIG. 2.

As the result, it becomes possible to improve the value $+I_{DC}$ for the saturation current value of the preamplifier 12.

However, it is required to consider the following point, in the embodiment of the present invention. If it is not considered, the noise current of the input section of the preamplifier 12 is increased and the characteristic at the minimum light input level is deteriorated.

More particularly, it is required to pay the attention to a parasitic capacity of the current source circuit (capacitance between the input of the preamplifier and ground), the noise component being generated in the current source circuit and the impedance of the current source circuit (it is more than the input impedance of the preamplifier).

Figure 3:
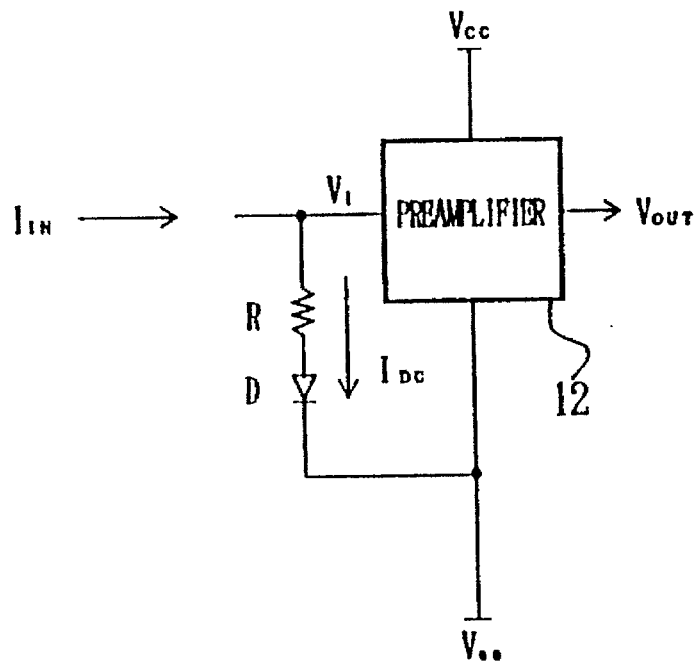
FIG. 3 is a block diagram showing the other embodiment to improve a saturation current of a preamplifier according to the present invention.

FIG. 3 is a diagram showing one embodiment for realizing the same purpose as shown in FIG. 1. In the embodiment shown in FIG. 3, the diode D is further connected to the resistor R in series and the forward direction, and is inserted between the input of the preamplifier 12 and the ground source, in comparison with the embodiment shown in FIG. 1.

Figure 4:
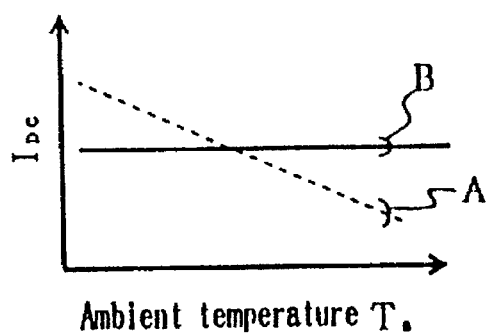
FIG. 4 is a diagram showing the $I_{DC}$ characteristic of a current bias to explain an operation shown in FIG. 3.

According to this structure, the temperature variation characteristic of the diode D may compensate the temperature variation of the DC voltage $V_1$ of the input section of the preamplifier 12, and keeps the current bias IDC constant for the variation of the ambient temperature $T_a$ as shown in FIG. 4.

In FIG. 4, the broken line A shows a characteristic of the current bias $I_{DC}$ for the ambient temperature $T_a$ shown in the embodiment of FIG. 1. In the diagram, the current bias $I_{DC}$ is reduced as the ambient temperature $T_a$ is risen.

On the other hand, the solid line B shown in FIG. 4 is a characteristic of the current bias $I_{DC}$ based on the embodiment shown in FIG. 3. As is apparent from the diagram, the current bias $I_{DC}$ keeps constant, even if the ambient temperature $T_a$ is varied. Therefore, characteristic deterioration according to the saturation of the preamplifier 12 can be improved regardless of the variation of the ambient temperature $T_a$.

Figure 5:
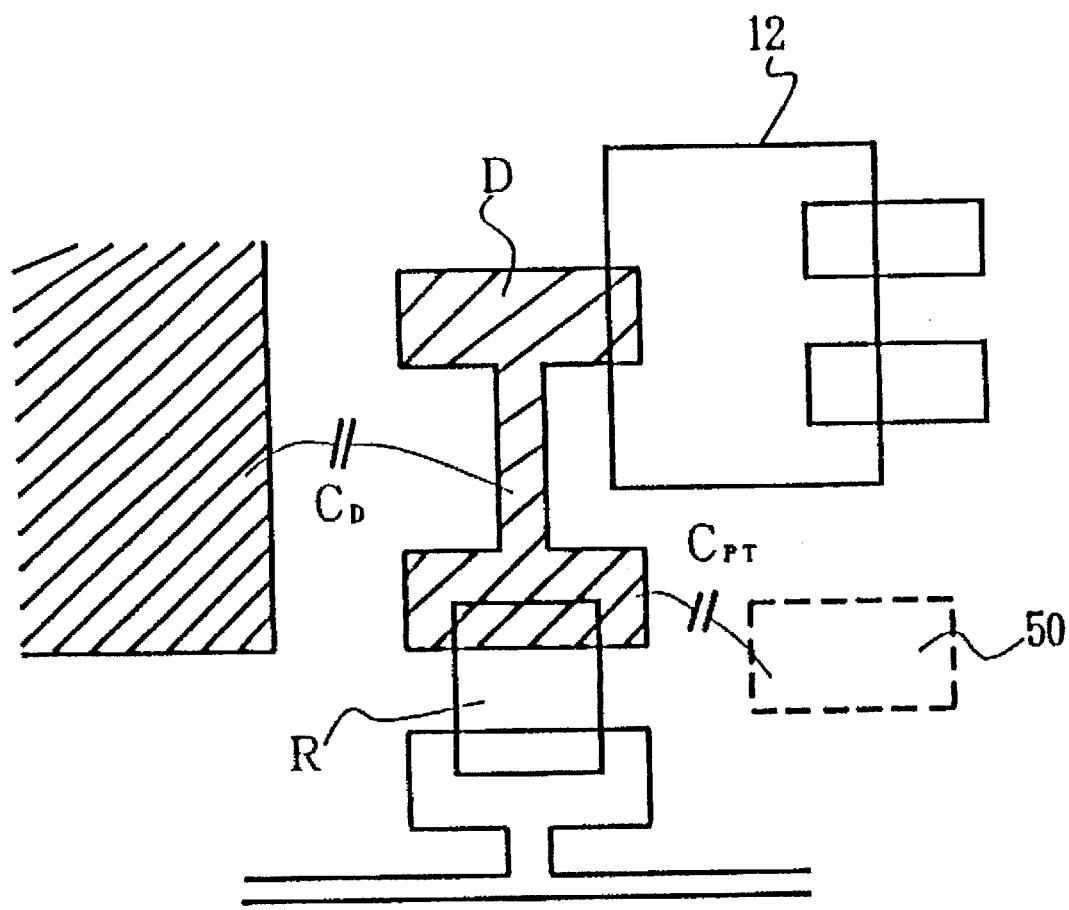
FIG. 5 is a diagram explaining the cause of generating a parasitic capacity.

FIG. 5 is a diagram explaining the problem of the parasitic capacity in the case where the preamplifier 12, resistor R and the diode D are mounted on a printed circuit board, according to the above-described embodiment shown in FIG. 3. In FIG. 5, the circuit elements are mounted on the both surfaces of the printed circuit board. In the diagram, symbol "D" is a diode, "R" is a resistor, and reference numeral "12" is a preamplifier. And these components are mounted and connected to one surface of the print plate.

Further, reference numeral "50" is a circuit part mounted to the rear surface of the printed circuit board. When the parts are mounted actually, there are provided a diode parasitic capacity $C_D$, which is generated between the diode D and the pattern adjacent to the diode D, as the parasitic capacity, a resistor parasitic capacity $C_R$ generated on the both ends of the resistor R, a printed pattern parasitic capacity $C_{PT}$ generated between the mounting part on the rear surface and the diode D or the like.

The relation between the parasitic capacity and the circuit structure is considered in FIG. 6. In the diagram, (I), (II) and (III) show an equalizing connecting circuit, a capacity equalizing circuit and composed capacity value order corresponding to the circuit structures (a) and (b), respectively.

(a) is a circuit structure in which the resistor R is connected to the input terminal of the preamplifier 12 and the diode D is connected between the resistor R and the ground as shown in (I) of FIG. 6. This structure has a connection corresponding to the structure shown in FIG. 3.

In the case of this circuit structure (a), the diode capacity $C_D$ is connected to the printed pattern parasitic capacity $C_{PT}$ in parallel, and the resistor capacity $C_R$ is connected to the diode capacity $C_D$ in series, as shown in (II) of FIG. 6, if the printed pattern parasitic capacity $C_{PT}$ between the circuit element mounted to the rear surface of the printed circuit board shown in FIG. 5. In this case, the composed capacity value is in order of $10^{-14}$, as shown in (III) of FIG. 6.

On the other hand, in the case of the circuit structure (b), the diode D is connected to the input terminal of the preamplifier 12 and the resistor R is connected between the diode D and the ground.

In this case, the resistor capacity $C_R$ is connected to the parasitic capacity $C_{PT}$ in parallel, as shown in (II) of FIG. 6, as the equalizing connecting circuit and the diode capacity $C_D$ is connected to the resistor capacity $C_R$ in series, if the printed pattern parasitic capacity $C_{PT}$ between the circuit element mounted to the rear surface of the printed circuit board and the diode capacity $C_D$, shown in FIG. 5, as shown in (I) of FIG. 6. In this case, the composed capacity value is in order of $10^{-13}$, as shown in (III) of FIG. 6.

Accordingly, the circuit structure (a) makes its advantage as the parasitic capacity can be made one tenth, in comparison with the circuit structure (b).

[Improvement of deterioration of an APD operative range]

Figure 7:
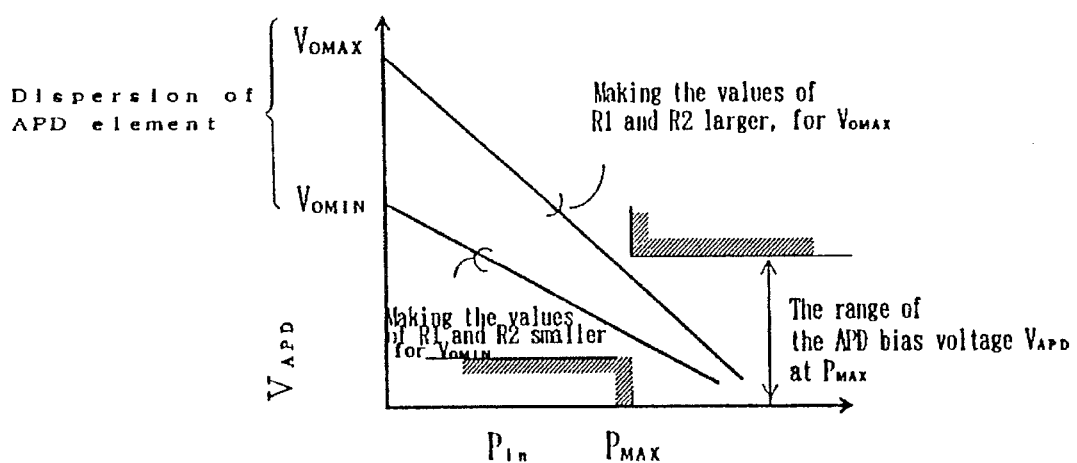
FIG. 7 is a diagram showing the relation between the optimum R1 and R2 corresponding to $V_0$ dispersion.

Next, FIG. 7 is a diagram for explaining the optimization for guaranteeing the APD operative range for an input level, that is, the dispersion of the light input power $P_{IN}$ and the self bias control voltage $V_0$.

Figure 35:
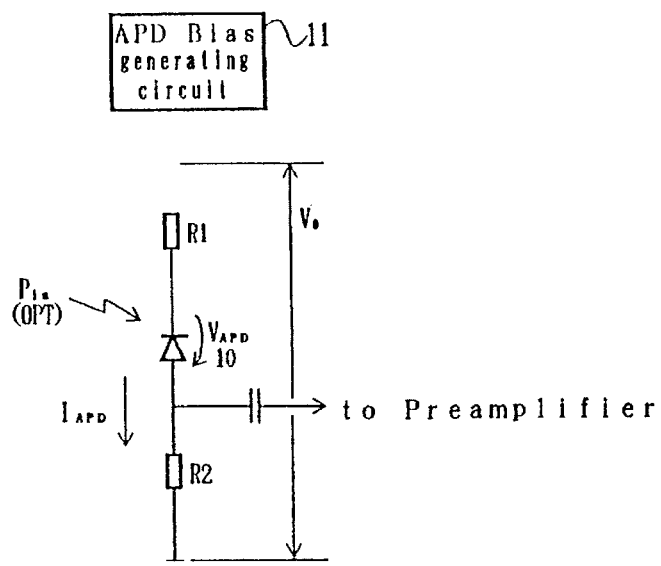
FIG. 35 is a diagram for explaining an APD bias control according to the self-bias system.
Figure 36:
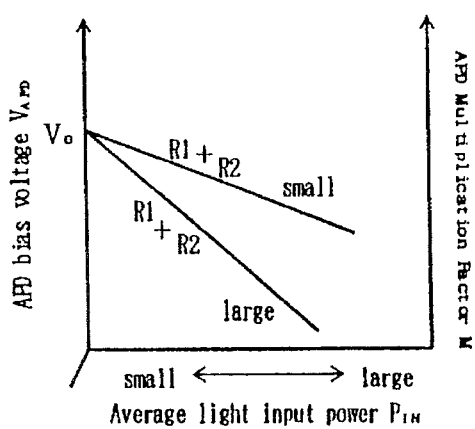
FIG. 36 is a diagram for explaining the relation between an average light input power and the multiplication factor of $V_{APD}$.
Figure 37:
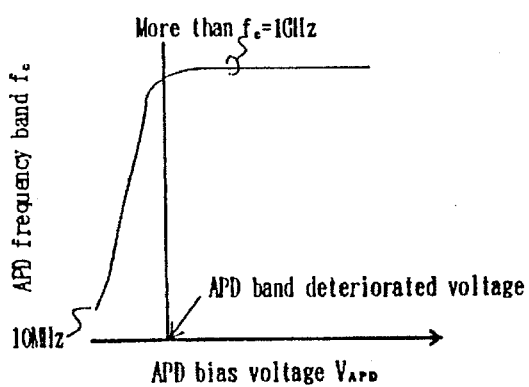
FIG. 37 is a diagram for explaining the relation between $V_{APD}$ and $f_c$.
Figure 38:
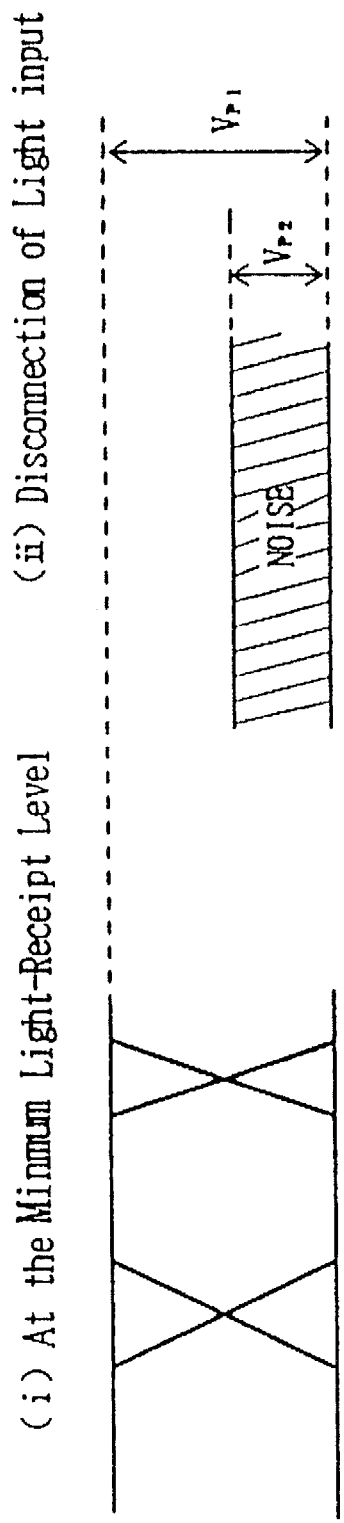
FIG. 38 is a diagram for explaining the output waveform characteristic of an equalizing amplifier to the $P_{IN}$.

The optimization is performed by setting the range where the APD bias voltage $V_{APD}$ should be controlled at the maximum light input level $P_{MAX}$, using the dispersion of the $V_0$ (the breakdown voltage $V_B$ of the light-receipt element: temperature inclination) as a parameter, and adjusting the value of the resistors R1 and R2 of the APD bias control circuit shown in FIG. 35, as described above.

In FIG. 7, the values of the resistors R1 and R2 are increased and adjusted so as to be in the range of the APD bias voltage $V_{APD}$, by making the values of the resistors R1 and R2 larger, for the maximum self-bias control voltage $V_{OMAX}$, and making the values of the resistors R1 and R2 smaller, for the minimum self-bias control voltage $V_{OMIN}$.

Hereupon, the control for the optimization shown in FIG. 7 is performed with the procedure in the flow shown in FIG.

Figure 8:
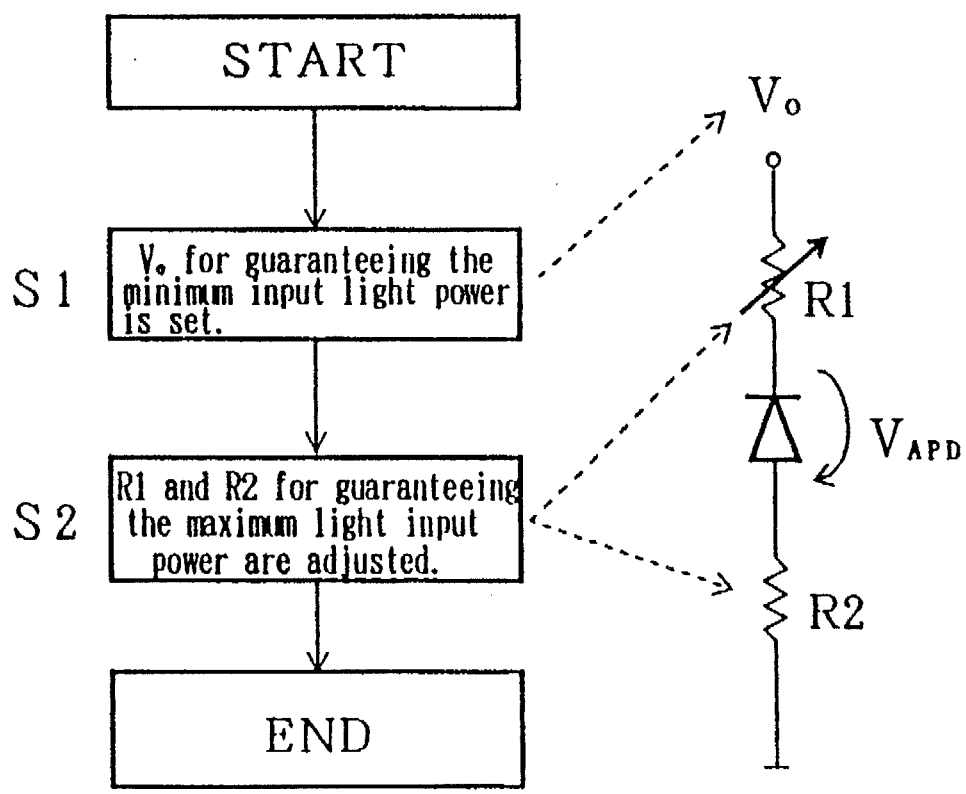
FIG. 8 is a flow showing a procedure for setting the optimum R1 and R2 corresponding to FIG. 7.

8, actually. In FIG. 8, at first, the self-bias control voltage $V_O$ for guaranteeing the minimum input light power is set (STEP S1).

And then, the resistors R1 and R2 for guaranteeing the maximum light input power are adjusted (STEP S2). These resistors R1 and R2 are adjusted by a variable resistor or by replacing a fixed resistor, as shown in the right section of FIG. 8. The resistor value is adjusted to the value obtained by calculating the resistor value for guaranteeing the $V_{APD}$, at the maximum light input power in the $V_O$.

Figure 9:
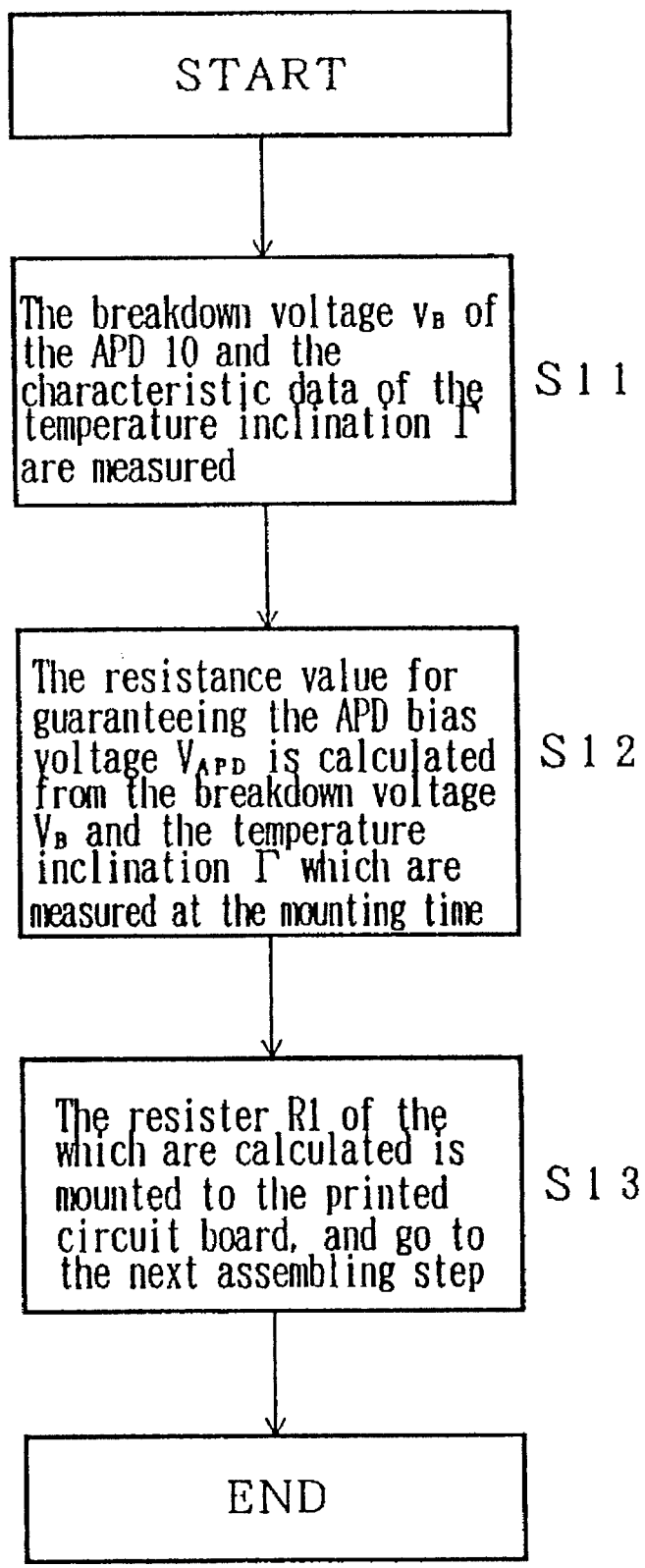
FIG. 9 is a flow showing a procedure for setting a resistor R1 at the time an APD is mounted.

Further, FIG. 9 shows a flow chart for explaining the adjusting procedure when the bias resistor is mounted at the assembling steps.

The breakdown voltage $V_B$ of the APD 10 and the characteristic data of the temperature inclination $\Gamma$ are measured (STEP S11). Then, the resistor value for guaranteeing the APD bias voltage $V_{APD}$ is calculated from the breakdown voltage $V_B$ and the temperature inclination $\Gamma$ which are measured at the mounting time (STEP S12). The resistor R1 of the resistance value calculated is mounted to the printed circuit board, and go to the next assembling step (STEP S13).

Consequently, the testing and adjusting steps after assembling of the light-receipt system can be omitted.

Figure 10:
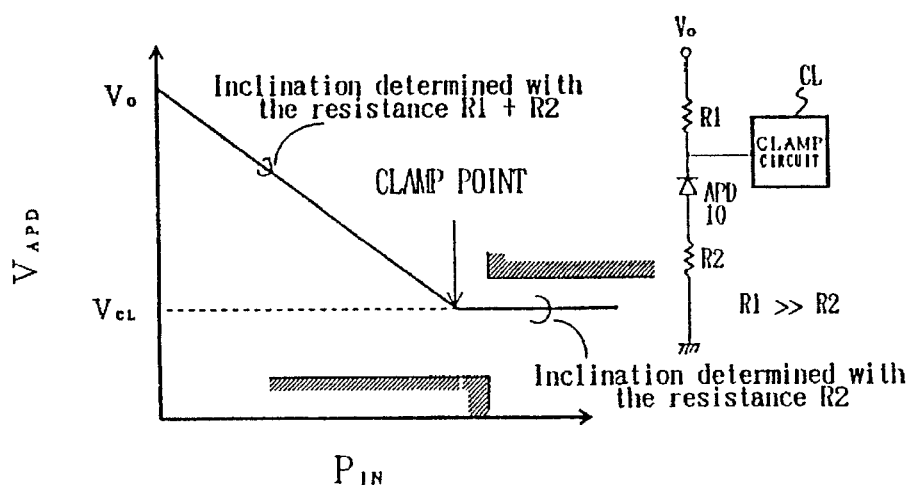
FIG. 10 is an explanatory diagram of a $V_{APD}$ clamping circuit operation according to the present invention.

Further, FIG. 10 is an explanatory diagram of the method for employing a clamping circuit to guarantee the APD operative range for the dispersion of the bias voltage $V_{APD}$ according to the temperature of the APD 10.

In the example of FIG. 10, the clamping circuit CL is provided on the APD, as shown in the right section of the diagram, to clamp with the voltage $V_{CL}$ which guarantees the range of the bias voltage $V_{APD}$ at the time of the maximum light input.

Accordingly, the self-bias control voltage $V_O$ characteristic of the APD 10 has a inclination which determines with the resistance R1+R2, within the range where it is larger than the clamp voltage $V_{CL}$, namely, the input light level $P_{IN}$ is $P_{MAX}$ or below, and the inclination is determined with the resistor R2 within the range where the voltage $V_O$ becomes constant with the clamp voltage $V_{CL}$. (Provided that R1>>R2).

Figure 11:
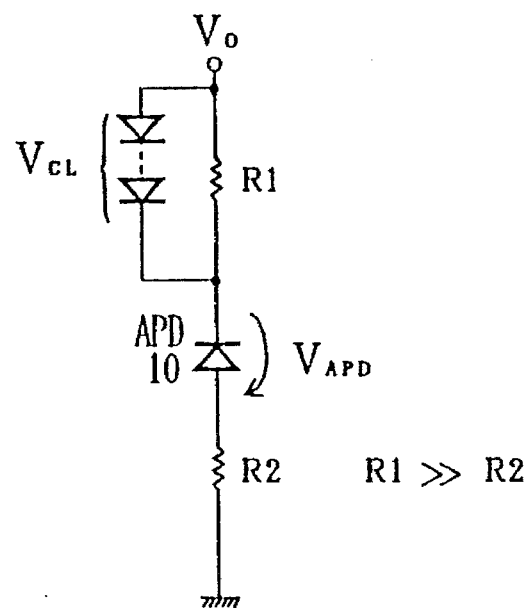
FIG. 11 is a concrete example of the clamping circuit.
Figure 12:
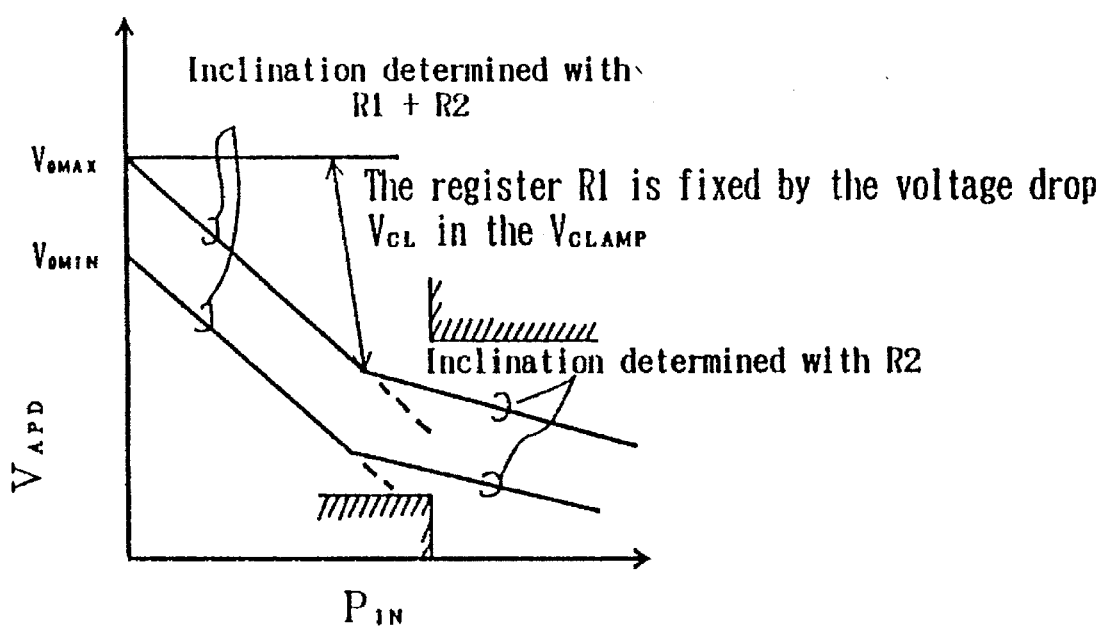
FIG. 12 is a diagram showing a $P_{IN}$-$V_{APD}$ characteristic corresponding to the circuit shown in FIG. 11.

FIG. 11 is an example of the clamping circuit CL shown in FIG. 10. The plural diodes connected in series, and forward direction are connected to the resistor R1 in parallel. As shown in FIG. 12, the $V_{APD}$ is obtained for the input light level $P_{IN}$, along the inclination determined by the resistors R1 and R2 on the state where the current flows to the resistor R1.

Further, as shown in FIG. 12, when the input light level $P_{IN}$ becomes larger, and the plural diodes become in the conductive state, the voltage drop between the both terminals of the resister R1 is fixed by the voltage drop $V_{CL}$ of the diodes connected in series. Accordingly, when the input light level $P_{IN}$ becomes larger, after then, the $V_{APD}$ is obtained along the inclination determined by the resistor R2.

Consequently, the bias voltage $V_{APD}$ of the APD 10 at the maximum light input level can be clamped and the deterioration of the operative range according as the $V_{APD}$ becomes smaller can be prevented.

Figure 13:
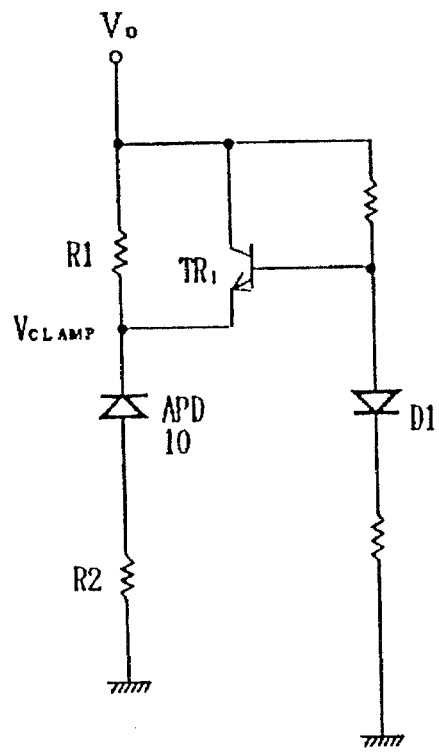
FIG. 13 is a diagram showing other concrete example of the clamping circuit.

FIG. 13 is other example of the clamping circuit CL. In the example, the cathode of the APD 10 is clamped by the transistor TR1 which operates with a fixed set voltage to prevent from deteriorating the operative range according as the bias voltage $V_{APD}$ becomes smaller.

In FIG. 13, the diode D1 is further connected between the base of the transistor TR1 and the ground. The voltage $V_{BE}$ characteristic between the base and emitter of the transistor TR1 is compensated with the temperature characteristic of this diode D1. Thus, the clamp voltage $V_{CLAMP}$ can be made constant, for the temperature change.

Figure 14:
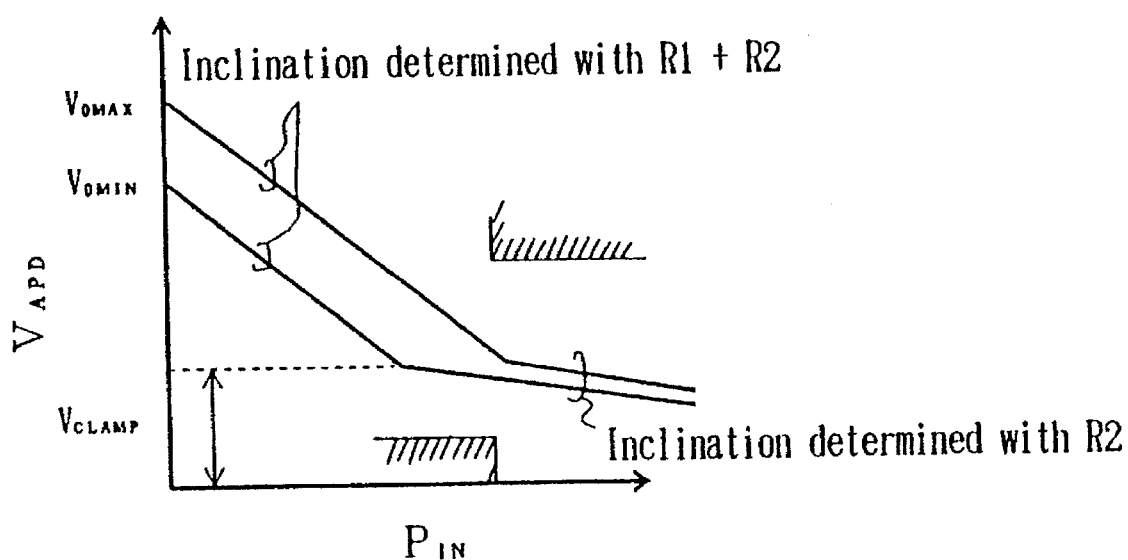
FIG. 14 is a diagram showing a $P_{IN}$-$V_{APD}$ characteristic corresponding to the circuit shown in FIG. 13.

FIG. 14 shows the characteristic of the $P_{IN}$–$V_{APD}$ shown in FIG. 13, in which the $V_{APD}$ is larger than the clamp voltage $V_{CLAMP}$, at the level which is the predetermined light input power $P_{IN}$ or below, having the inclination determined the resistor R1+R2, and the $V_{APD}$ is fixed to the clamp voltage $V_{CLAMP}$ at the level which is the predetermined light input power $P_{IN}$ or above.

Further, the clamp voltage $V_{CLAMP}$ compensates so as to cancel the voltage $V_{BE}$ characteristic between the base and the emitter of the transistor TR1 at the temperature characteristic of the diode D1, so that it can obtain the constant inclination characteristic determined by the resistor R2.

[Optimization of the multiplication factor M at the minimum light-input power]

Figure 15:
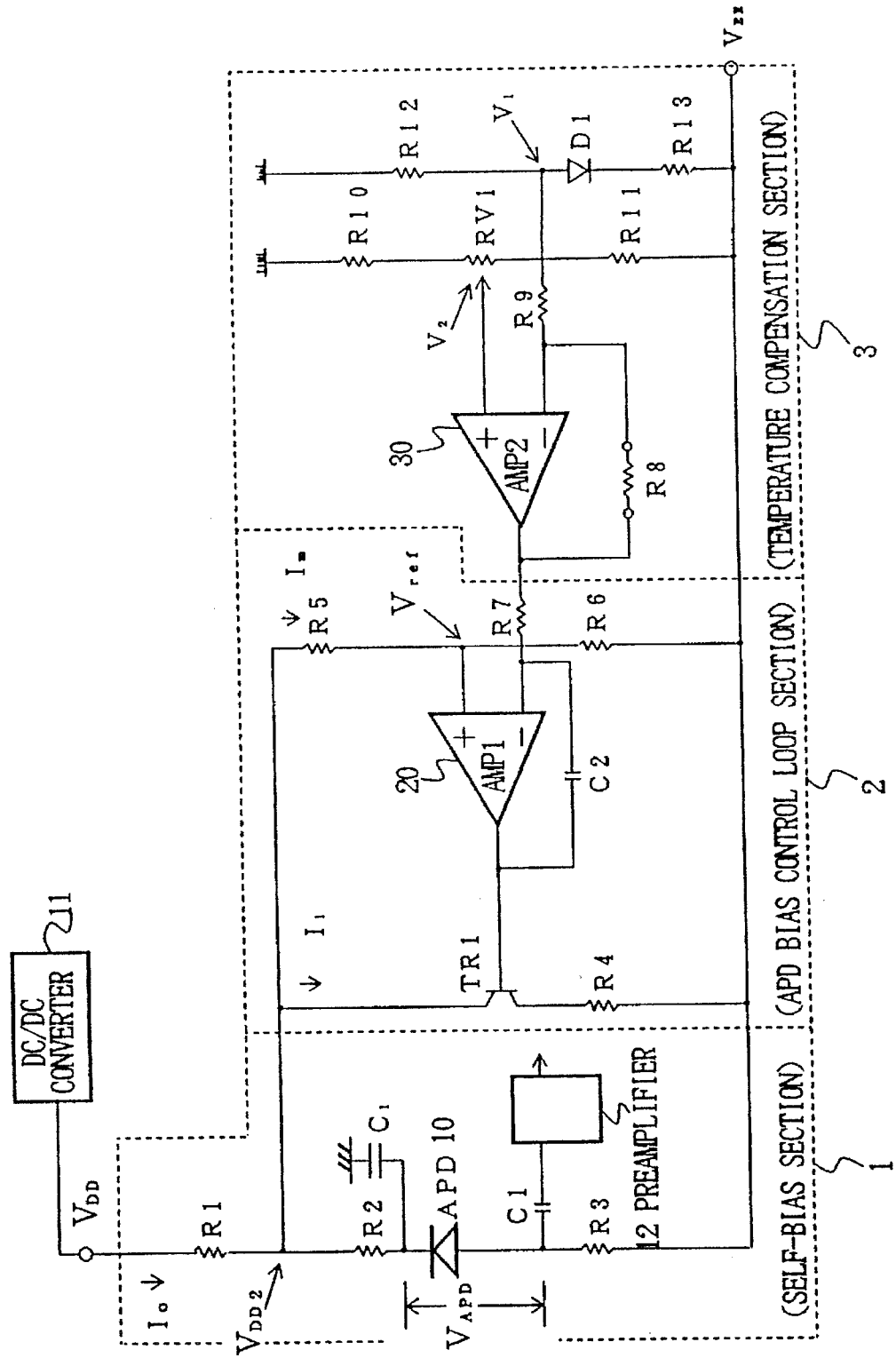
FIG. 15 is a diagram showing a circuit of one embodiment of the present invention.

FIG. 15 is a circuit showing the other embodiment of the present invention, in which the control of the optimum value ($M_{OPT}$) of the multiplication factor M can be performed, more particularly, at the minimum light-receipt power, so that the maximum value, of the multiplication factor M makes $M_{OPT}$, and the noise generated according to the increase of the multiplication factor M at the time the light input is disconnected is prevented.

Figure 16:
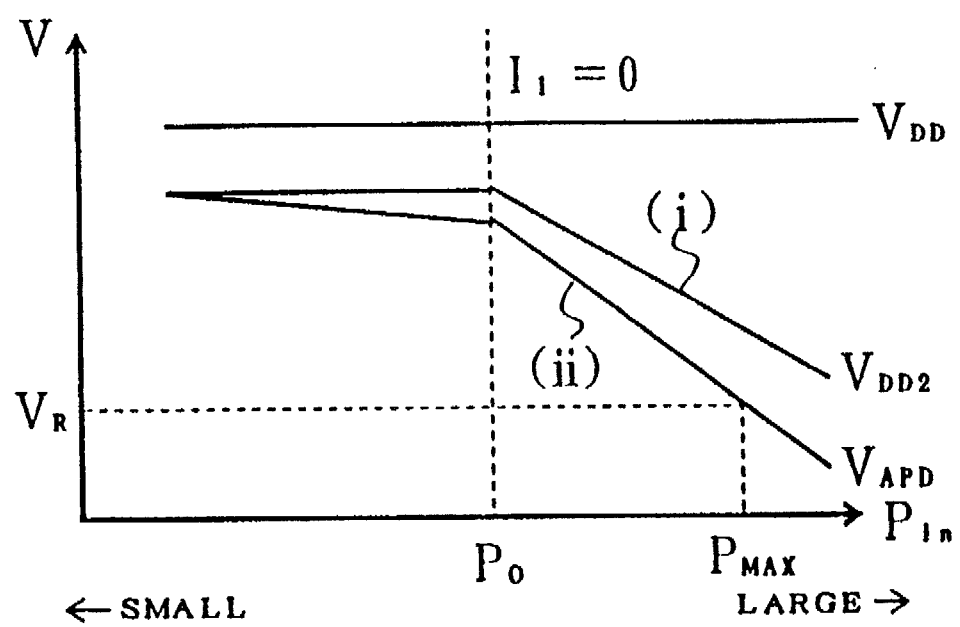
FIG. 16 is an operational explanation diagram of the embodiment shown in FIG. 15.
Figure 17:
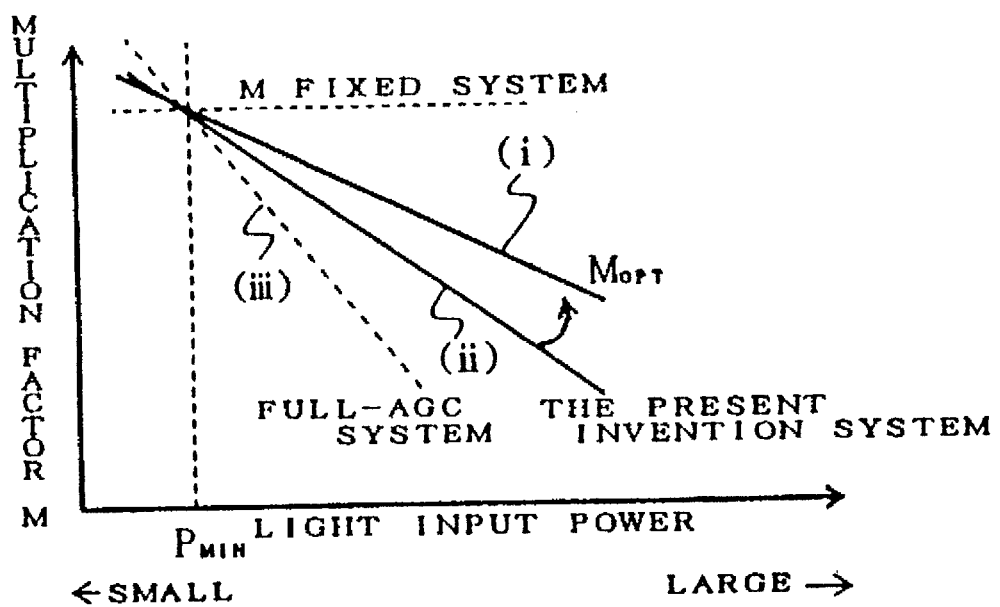
FIG. 17 is a diagram for explaining a relation between the multiplication factor control system and the optimum multiplication factor according to the present invention.

FIG. 16 is an explanatory diagram of the operation according to the embodiment of the present invention shown in FIG. 15, and FIG. 17 is a diagram showing the relation between the multiplication factor control method and the optimum multiplication factor of the present invention.

In FIG. 15, a self-bias section 1 employs a self-bias system in which the avalanche photo diode APD controls the bias voltage by using the voltage drop of the first resistor R1, the second resistor R2 and the third resistor R3 by itself, because the bias current of the avalanche photo diode APD is changed according to the light input power. As shown in the diagram, the first resistor R1 and the second resistor R2 are connected to the cathode of the APD 10 in series, and the third resistor R3 is connected to the anode of the APD 10 as a load resistor.

The voltage potential generated in the third resistor R3 which is a load resistor is led to the preamplifier 12 via the condenser C1 as a light-receipt output. The output amplified in the preamplifier 12 is inputted to the equalizing amplifier 13 and the like as same as explained in FIG. 32.

Figure 32:
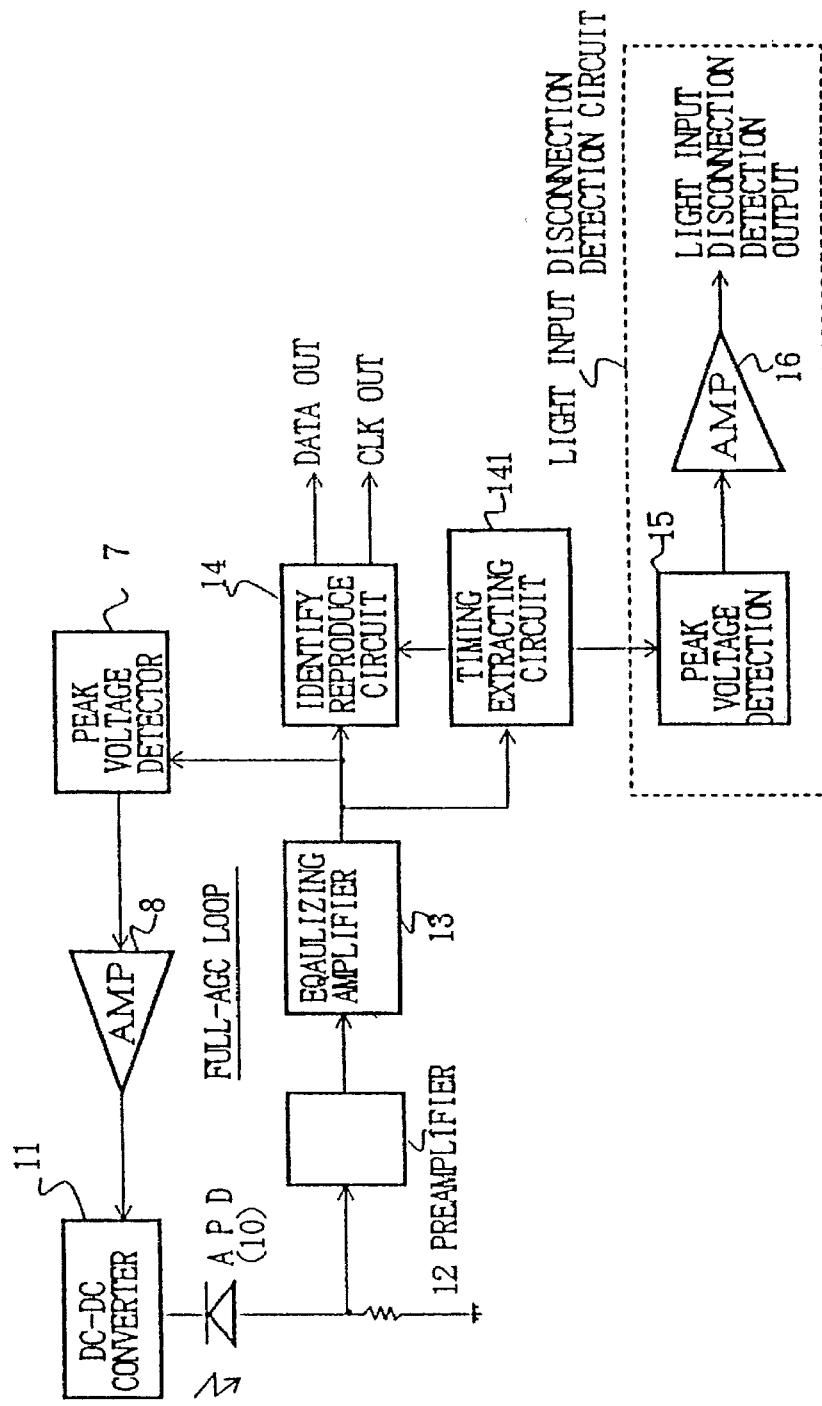
FIG. 32 is a block diagram of one structure of the conventional light-receipt system.
Figure 33:
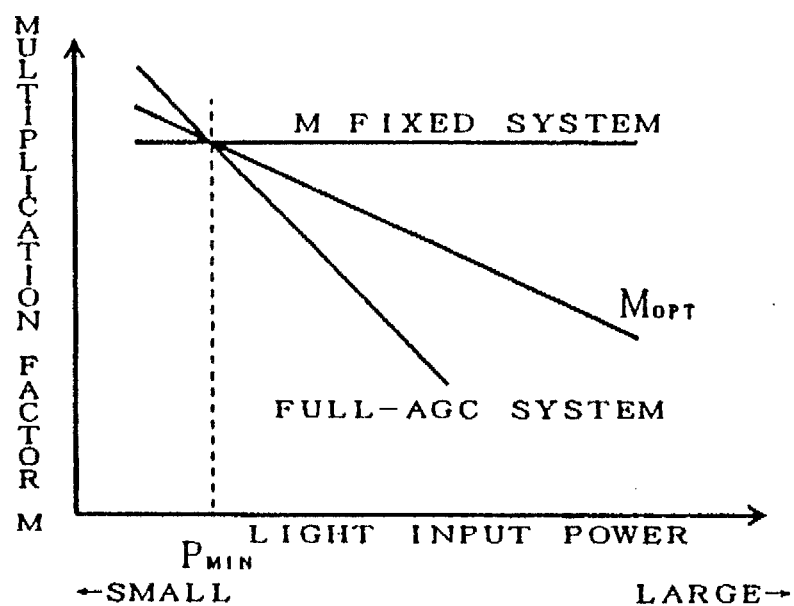
FIG. 33 is a diagram showing the relation between the conventional multiplication factor control system and the optimum multiplication factor.
Figure 34:
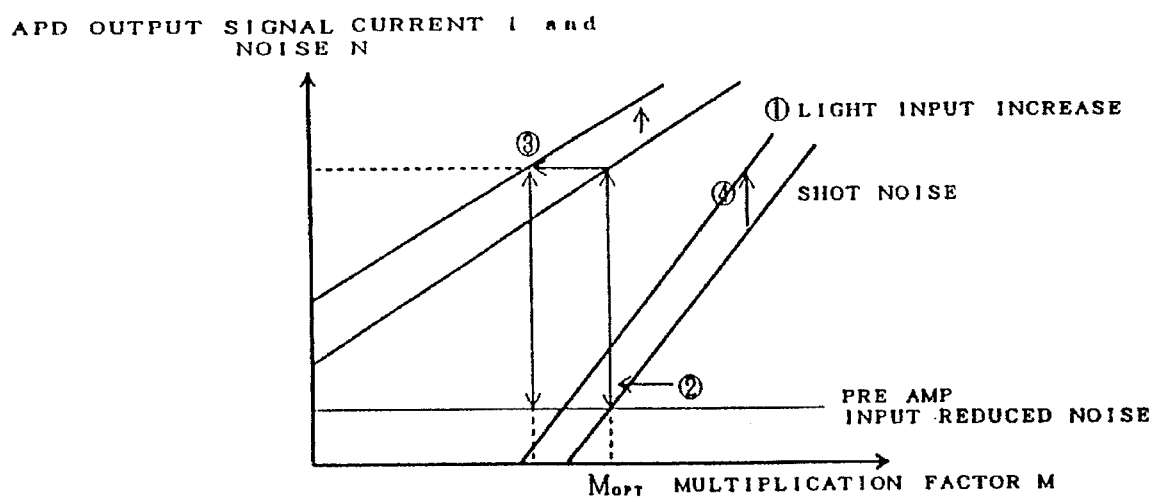
FIG. 34 is a diagram showing the relation between the conventional APD output signal current and the noise and the multiplication factor.

Provided that, the structure of the embodiment of the present invention shown in FIG. 15, does not include the structure for feed-backing a control signal to the DC/DC convertor 11, so as that the amplitude of the light-receipt output to be constant, in comparison with that of FIG. 32, because it is a self-bias system.

Further, in FIG. 15, although the voltage potential generated in the third resistor R3 is led to the preamplifier 12 via the condenser C1, as a light-receipt output, the present invention is not limited to this.

More particularly, it is possible to connect so as to lead the anode of the avalanche photo diode APD 10 to the preamplifier 12 directly without providing the third resistor R3, and amplify, identify and reproduce the current flowing to the avalanche photo diode APD 10 as a light-receipt output.

The voltage potential of the junction point between the first resistor R1 and the second resistor R2 is $V_{DD2}$, and the bias control loop section 2 described later is connected to the voltage potential as a bypass current path.

$V_{DD}$ is made enough large with taking the break-down voltage $V_B$ of the avalanche photo diode APD 10 into consideration, and the values of the first resistor R1, the second resistor R2 and the third resistor R3 are determined by the maximum rated current of the avalanche photo diode APD 10.

The values of first resistor R1, the second resistor R2, and the third resistor R3 are in the ratio 8:4:1 in the embodiment. To be concrete, as a first requirement, the values of the first resistor R1, the second resistor R2 and the third resistor R3 are determined so as to set such the bias voltage $V_{APD}$ that prevents the avalanche photo diode APD from being broken-down, when the maximum rated current flows.

Further, as a second requirement, the values of the current $I_1$ of the bias control loop section 2 and the first resistor R1 are determined so as that the control of the optimum value ($M_{OPT}$) of the multiplication factor M can be performed by the potential $V_{DD2}$ at the junction point between the first resistor R1 and the second resistor R2, when the light-receipt power is minimum. Therefore, the maximum value of the multiplication factor M becomes $M_{OPT}$, so that it becomes possible to shut out the noise made with increasing the multiplication factor M, when the light input is disconnected.

The bypass control loop section 2 controls so as to keep the potential $V_{DD2}$ of the junction point between the first resistor R1 and the second resistor R2 constant with a simple structure. It is different from the structure of the FULL-AGC loop keeping the output amplitude constant (keeping the bias current of the avalanche photo diode APD 10 constant at the time nearly minimum light-receipt).

The series connection between the transistor TR1 and the fourth resistor R4 is inserted between the junction point, which is between the first resistor R1 and the second resistor R2, and the terminal of the third resistor R3 opposite to the APD 10 in parallel.

Further, the series connection between the fifth resistor R5 and the sixth resistor R6 is connected in parallel to the series connection. And a first operational amplifier 20 of which the + input terminal is connected to the junction point between the fifth resistor R5 and the sixth resistor R6. The output of the temperature compensation section 3 is inputted via the seventh resistor R7 to the—input terminal of the first operational amplifier 20.

A capacitor C2 is connected between the—input terminal and the output terminal of the first operational amplifier 20. Further, the output of the first operational amplifier 20 is led to the base of the transistor TR1 for controlling the current $I_1$, by varying the conductivity impedance of the transistor TR1.

On this structure, in the case where the potential $V_{DD2}$ of the junction point between the first resistor R1 and the second resistor R2 is changed, the current flowing to the fifth resistor R5 and the sixth resistor R6 is changed.

Accordingly, the potential $V_{ref}$ of the junction point of the fifth resistor R5 and the sixth resistor R6 is also changed, similarly. Therefore, the output of the first operational amplifier 20 keeps the current $I_0$ constant, so that the size of the current $I_1$ is controlled by controlling the transistor TR1 so as to make the potential $V_{DD2}$ constant.

When the range for controlling to make the potential $V_{DD2}$ constant is exceeded (the point to be the current $I_1=0$), the value of the potential $V_{DD2}$ becomes small, in proportion to the size of the light input power [refer to (i) of FIG. 16].

Hereupon, the current $I_1$ is controlled to become $I_1=0$, when it is one light input power $P_0$, as shown in FIG. 16, the voltage drop becomes larger in the first resistor R1, the second resistor R2 and the third resistor R3, according as the light input power becomes larger, and further, the bias voltage $V_{APD}$ of the avalanche photo diode APD 10 is dropped [(ii) of FIG. 16].

Accordingly, the multiplication factor M is dropped, corresponding to the drop of the bias voltage $V_{APD}$ of the APD (FIG. 17).

Further, to summarize the above explanation, referring to FIG. 16, $V_{DD2}$ is kept constant on the side where the light input power is dropped as a turning point of the optional light input power $P_0$, and controlled by using the voltage drop with the second resistor R2 and the third resistor R3 connected to the anode and the cathode of the avalanche photo diode APD 10 in series.

The transistor TR1 of the bias control loop 2 becomes OFF on the side where the light input power is increased, and the multiplication factor M of the APD 10 is self-bias controlled by using the optional light input power $P_0$ as a turning point, and further, using the voltage drop of the first resistor R1 in addition to the second resistor R2 and the third resistor R3.

Further, returning to FIG. 15, the loop time constant in the bias control loop 2 is determined with the capacitor $C_2$ and the seventh resistor R7, and the cut-off frequency becomes $f_c = 1/2\pi C_2 R7$.

In FIG. 15, the second operational amplifier 30 is provided in the temperature compensation section 3. The voltage $V_2$ obtained by the series connection of the tenth resistor R10, the eleventh resistor R11, and the variable resistor $R_{V1}$ is inputted to the + input terminal of the second operational amplifier 30, and further, the voltage $V_1$ obtained by the series connection of the twelfth resistor R12, the thirteenth resistor R13 and the diode D1 is inputted via the ninth resistor R9, to the—input terminal of the amplifier 30.

The diode D1 functions as a temperature compensator for the break-down voltage $V_B$ of the APD 10. The diode 10 may be substituted with the element having the temperature inclination characteristic, such as posistor, thermistor or the transistor.

Further, the temperature compensation section 3 has a function for controlling the optimum multiplication factor $M_{OPT}$. This control of the optimum multiplication factor $M_{OPT}$ is performed by the variable resistor $R_{V1}$.

In FIG. 17, (i) of FIG. 17 shows the characteristic of the optimum multiplication factor $M_{OPT}$ and (iii) of FIG. 17 shows the characteristic of the multiplication factor M according to the conventional FULL-AGC system.

The characteristic is controlled, as that of (ii) of FIG. 17, by controlling the variable resistor $R_{V1}$ so as to approximate to the optimum multiplication factor $M_{OPT}$ according to the present invention.

The temperature compensation for the break-down voltage $V_B$ uses the temperature characteristic of the diode D1. The inclination of this temperature characteristic is gained with the eighth resistor R8 and the ninth resistor R9, and further is amplified by the gain of the first operational amplifier 20 by two times, so that the $V_{DD2}$ has the characteristic of the temperature inclination.

The temperature inclination of $V_{DD2}$ is defined from the following relation;

The temperature characteristic of the Diode D1×R8/R9×(1+R5/R6)

As described above, the problem of the conventional circuit and system shown in FIGS. 31 through 34 will be solved. Further, in FIG. 15, it is possible to obtain a bias circuit of the avalanche photo diode APD 10 which has a stability against to the power variability, by supplying a power voltage $V_{EE}$ from a stabilized power supply.

[Stabilization of an operation for detecting the disconnection of a light input]

Hereupon, it is difficult to obtain the difference of the peak voltage by which the disconnection of the light input can be detected in the comparator 16 (FIG. 27), if the gains of the preamplifier 12 and the equalizing amplifier 13 connected to the output of the preamplifier 12, are set large enough, as the signal level inputting to the preamplifier 12 is minute.

Accordingly, it is required to miniaturize the light-receipt system described above, and therefore, it brings the problem of the oscillation caused by a various of reasons, in the case where the above-described amplifier having a high gain is mounted on the system.

Figure 18:
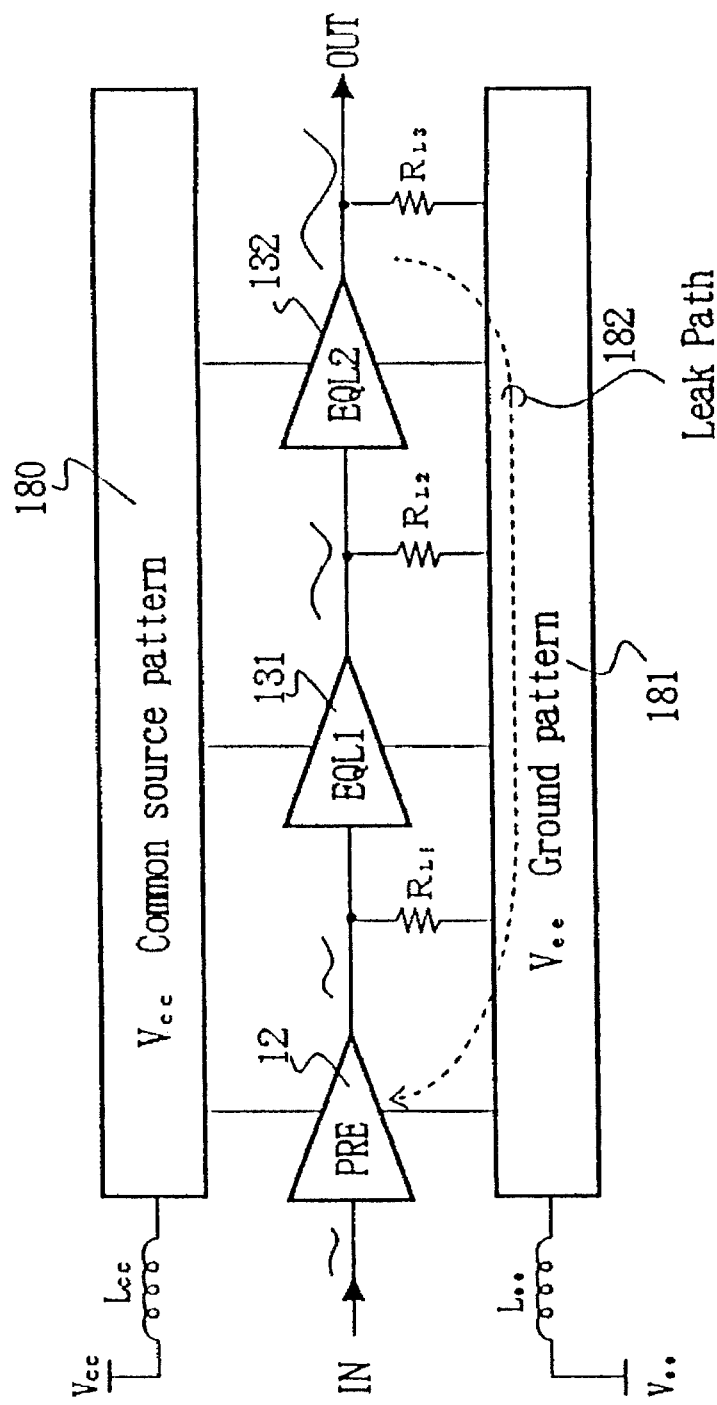
FIG. 18 is an explanatory diagram of a leak path at the time an amplifier having a high gain is connected.

FIG. 18 is a diagram for explaining the problem of the oscillation according to the leak in the light-receipt system. In the diagram, the preamplifier 12 and the two stages of the equalizing amplifiers 131 and 132 are connected in cascade.

These amplifiers have impedances between the common source pattern 180 ($V_{cc}$), the ground pattern 181 ($V_{ee}$) and the reference ground point (reference ground of light-receipt system case) having wide areas. In the diagram, $L_{cc}$ and $L_{ee}$ are inductance components due to the interface pins and patterns described latter.

As shown with the broken line 182 in the diagram, the leak path is formed via the above-described ground pattern 181 having wide area between the input of the amplifier 12 having a high gain and the output of the equalizing amplifier 132, thus generating oscillation. In this case, the disconnection of the light input can not be detected.

Figure 19:
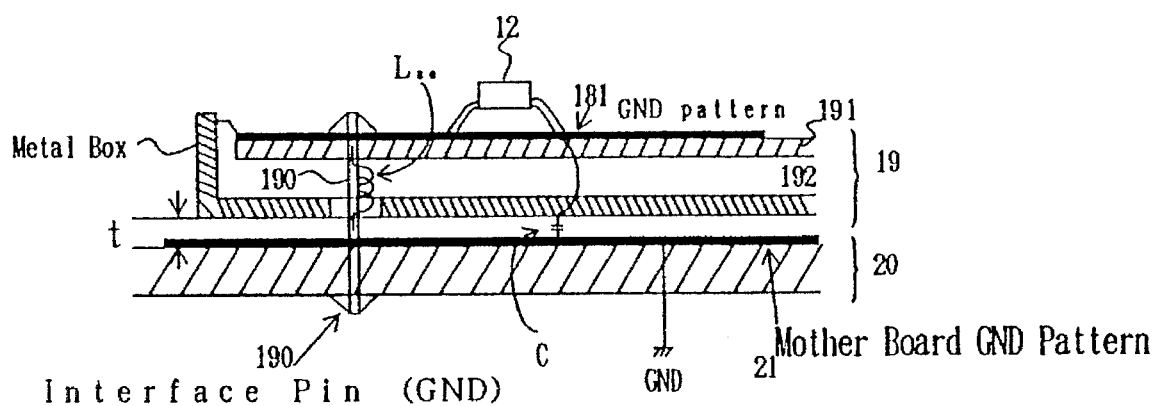
FIG. 19 is an explanatory diagram of a resonant circuit at the time a circuit is mounted to a mother board.
Figure 20:
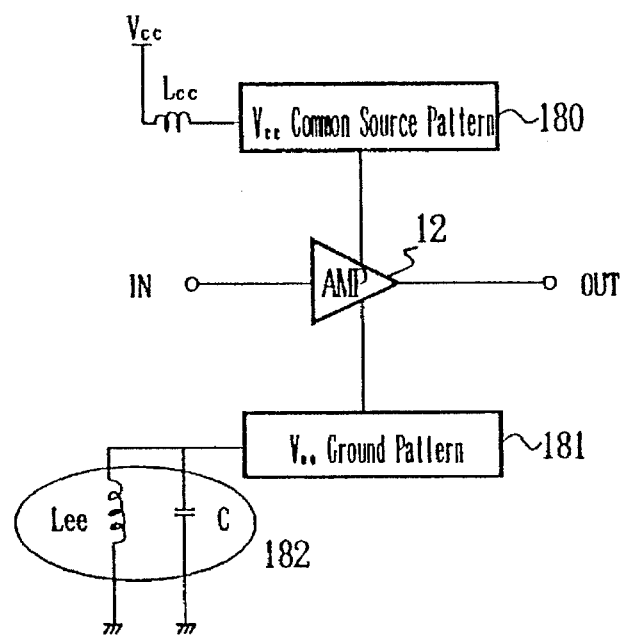
FIG. 20 is a diagram showing an equalizing circuit shown in FIG. 19.

FIGS. 19 and 20 are diagrams for explaining the problem of the oscillation in the case where the amplifier having a high gain is mounted to the mother board of the light-receipt system. If the reference potential is used as the ground, when the case of the light-receipt system is made of a conductive box (of conductive metal and the like), a resonant circuit is formed by a capacity according to the gap between the bottom of the light-receipt system and the mother board signal GND pattern which is adjacent to the bottom, and an inductor component of an interface pin of the light-receipt system.

Therefore, the amplifier having a high gain oscillates with the resonant frequency of the resonant circuit.

In FIG. 19, the preamplifier 12 used as an amplifier having a high gain is mounted to the printed circuit board 191 of the light-receipt system 19. Reference numeral 181 is a ground pattern formed on the printed circuit board 191.

Further, numeral "192" is a box or case having conductivity of the light-receipt system 19. On the other hand, reference numeral "20" is a mother board, and "21" is a reference ground pattern formed on the mother board 20.

The reference ground pattern 21 formed on this mother board 20 is connected to the ground pattern 181 of the light receipt system 19 by the interface pin 190.

As described in the example of FIG. 18, the interface pin 190 shows the inductor component $L_{ee}$, and the gap between the bottom of the case 192 having conductivity and the reference ground pattern 21 formed on the mother board 20 shows the capacity component C.

As shown in FIG. 20, which shows the equivalent circuit of FIG. 19, the resonant circuit 182 is formed by the inductor component $L_{ee}$ and the capacity component C, so that the amplifier is oscillated.

According to the present invention, the oscillation on the amplifier described above is prevented in the light receipt system so that the disconnection of the light input can be detected stably.

Figure 21:
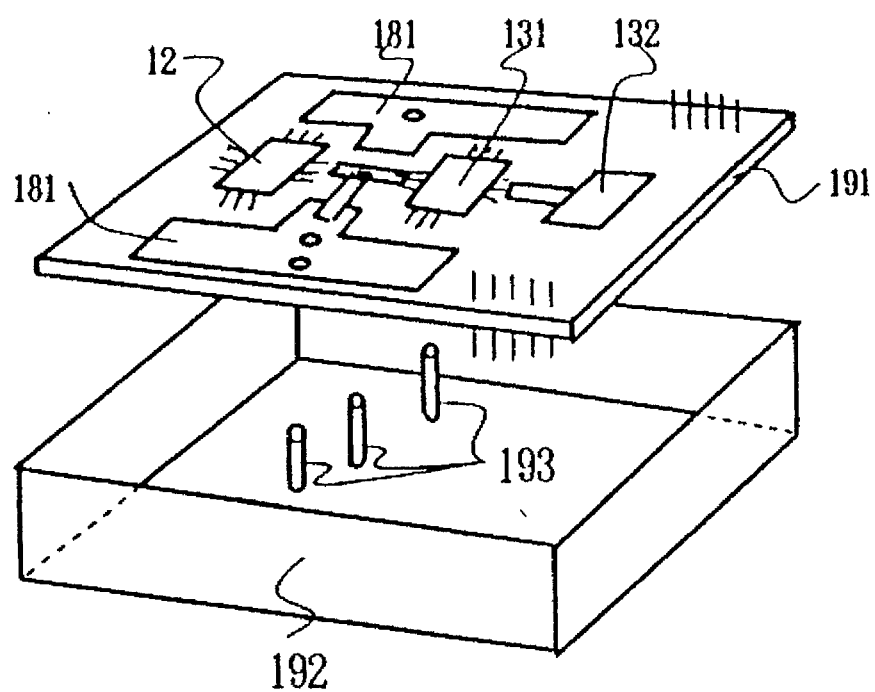
FIG. 21 is a diagram for explaining the connection of the pins between the operation box and the $-P,GND$ pattern.

FIG. 21 shows one embodiment for preventing the oscillation of the above-described amplifier, in which impedance according to the inductor formed between the ground pattern and reference ground pattern is lowered by the plural conductive pins standing on the box of the light-receipt system.

Consequently, the embodiment of FIG. 18 can realize that the system is mounted, preventing the leak via the ground pattern.

In FIG. 21, reference numeral "192" is a box having conductivity of the light-receipt system, having plural conductive pins 193, which stand from the bottom surface of the box. Numeral "191" is a printed circuit board, on which the chips of the preamplifier 12, the equalizing amplifiers 131 and 132 are provided, and the ground pattern 181 is also formed.

The ground pattern 181 is connected to the above-described plural conductive pins 193 in parallel. Accordingly, impedance according to the inductance formed between the ground pattern 181 and the reference ground pattern 21 is lowered so that the oscillation is prevented.

Figure 22:
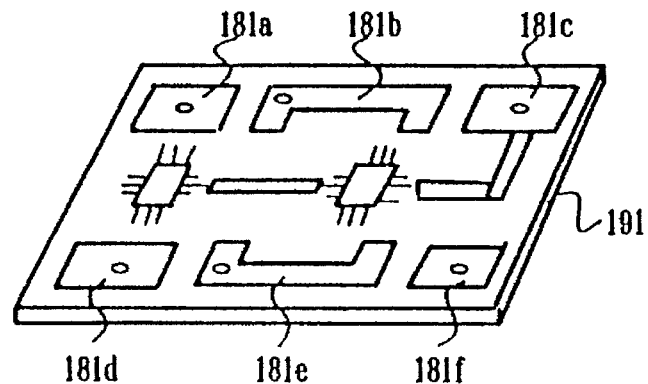
FIG. 22 is a diagram for explaining separation of a GND pattern from an input to an output of an amplifier.
Figure 22:
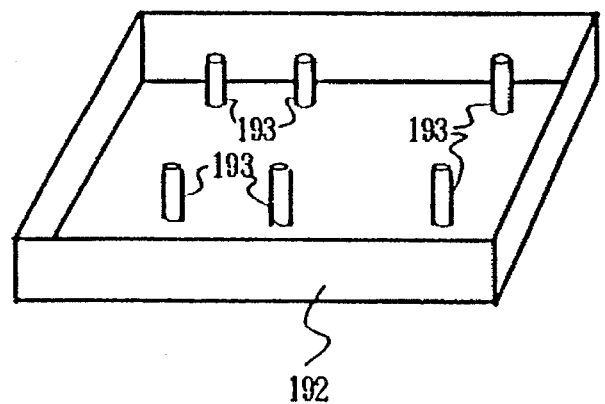

FIG. 22 shows the other embodiment to realize the mounting for further preventing the leak on the ground pattern 181. As explained in FIG. 18, the leak path 182 is formed on the ground pattern 181, so that the signal is feed backed and the oscillation is generated. Accordingly, the leak path 182 is divided by separating the ground pattern 181 to plural patterns.

In FIG. 22, the preamplifier 12, the equalizing amplifiers 131 and 132 are provided on the printed circuit board 191, as same as the embodiment shown in FIG. 21. The different point from the embodiment shown in FIG. 21 is that the ground pattern 181 is separated to the plural patterns 181a through 181f.

Further, reference numeral "192" is a box having conductivity of the light-receipt system, which is provided so as to connect corresponding to the multiple GND patterns 181a through 181f divided the plural conductive pins 193.

Figure 23:
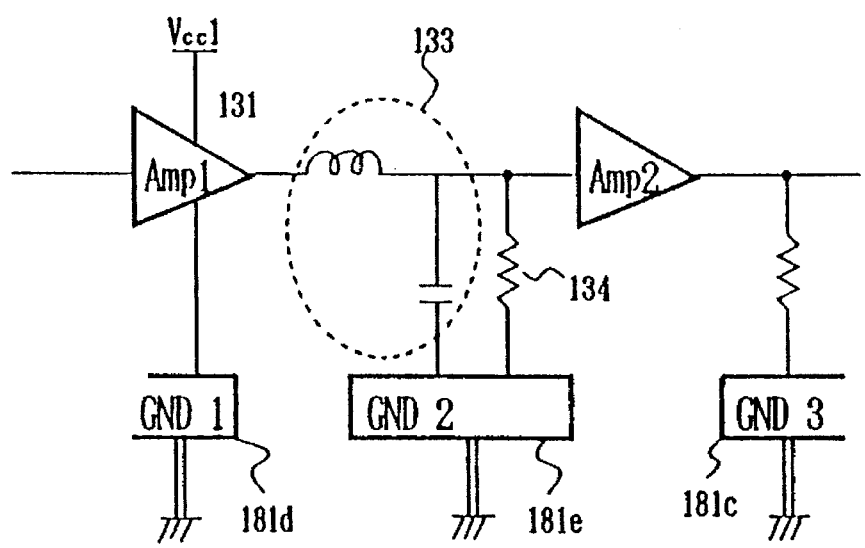
FIG. 23 is a diagram showing an equalizing circuit shown in FIG. 22.

FIG. 23 shows a part of the mounted equivalent circuit of FIG. 22. The divided ground patterns 181c through 181e are connected to the reference ground potential of the box by the conductive pins 193 corresponding to each patterns. In the diagram, reference numerals "133" is a path filter, and numeral "134" is a terminal resistor. The equalizing amplifier 13 is composed of the path filter 133, the terminal resistor 134, and the amplifier.

As shown in FIGS. 22 and 23, the ground pattern 181 is divided to prevent from forming the leak path 182, so that the oscillation can be prevented, as the result.

Figure 24:
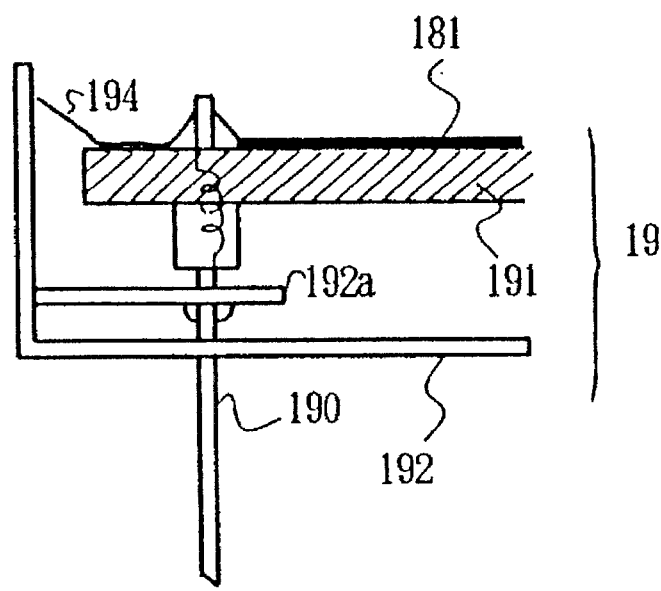
FIG. 24 is a diagram showing one example of connection of an interface pin.

FIG. 24 is a concrete example for mounting to prevent from forming the oscillating circuit, due to the inductor with the interface pins between the ground pattern and the reference ground pattern.

In the embodiment shown in FIG. 19, the ground pattern 181 formed on the printed circuit board 191 of the light-receipt system 19 is connected to the reference ground pattern 21 of the mother board 20 via the interface pin 190.

Figure 25:
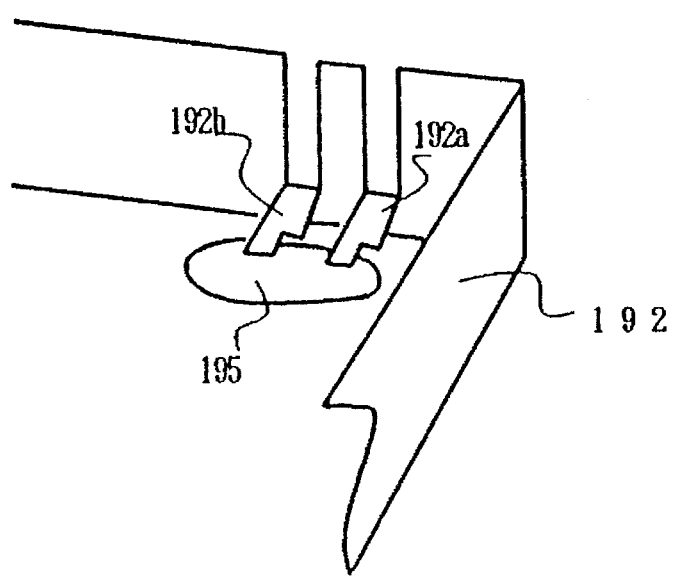
FIG. 25 is a diagram explaining a cutting section of the operation box shown in FIG. 24.

In this example, there is an possibility of that the inductor component Lee based on the length of the interface pin 190 is generated and the resonant circuit shown in FIG. 20 is formed and it becomes the reason of the oscillation. Then, in the embodiment shown in FIG. 24, the length of the interface pin 190 is shorten substantially, by cutting out a part of the box 192 having conductivity of the light-receipt system 19 and bending it as a cut portion 192a, and connecting it to the interface pin 190. FIG. 25 is a diagram for further explaining the cut portion of the box 192 having conductivity. In FIG. 25, two cut portion 192a and 192b are formed on the box 192 having conductivity, and bent so as to parallel to the bottom surface of the box 192 having conductivity. Reference numeral "195" is an opening formed on the bottom of the box 192 having conductivity.

The catted portions 192a and 192b are connected to the interface pin 190, through the opening 195, electrically by soldering and the like. Accordingly, the length from the interface pin 190 to the connecting point with the reference ground pattern 21 of the mother board 20 (refer to FIG. 19) is shortened, equivalently. Thus, the size of the inductor according to the interface pin 190 can be reduced.

Figure 26:
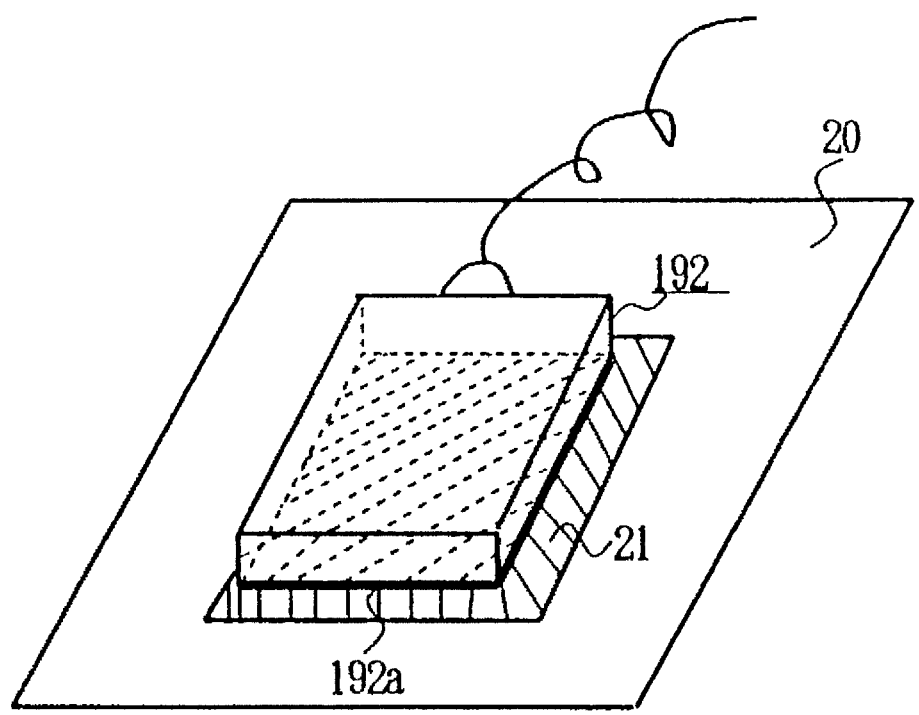
FIG. 26 is a diagram explaining one example for mounting an operation box to a mother board.
Figure 27:
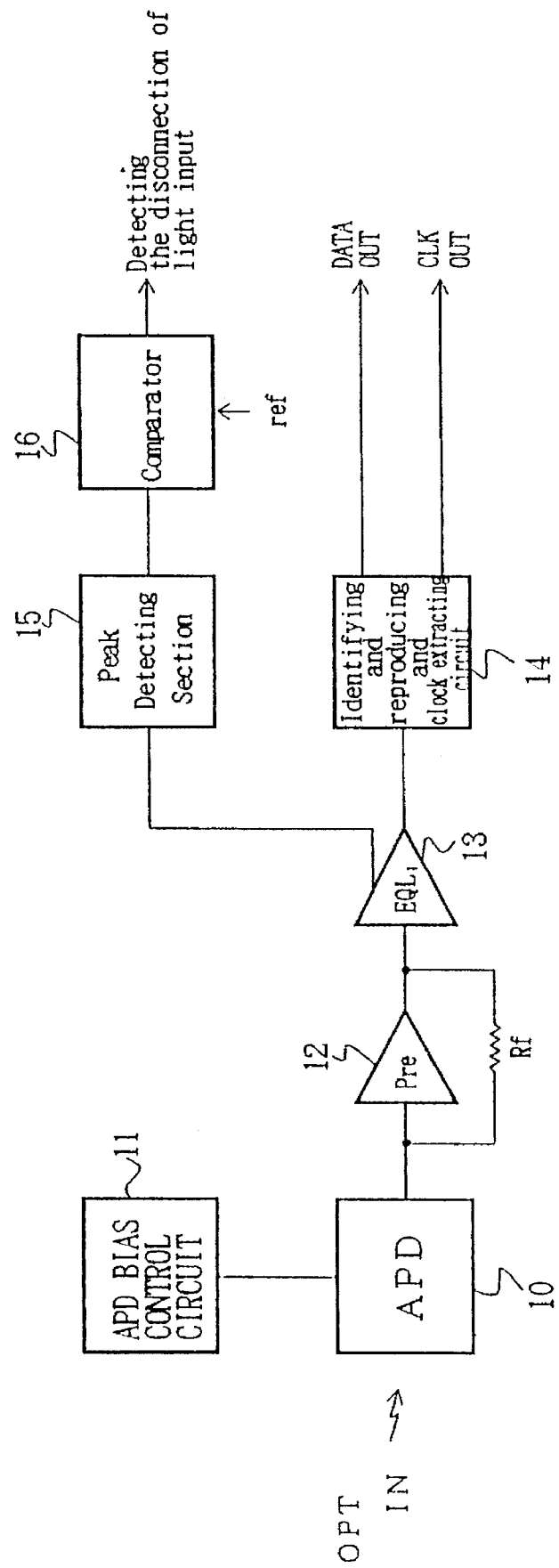
FIG. 27 is a block diagram showing a structural example of a general light-receipt system.
Figure 28:
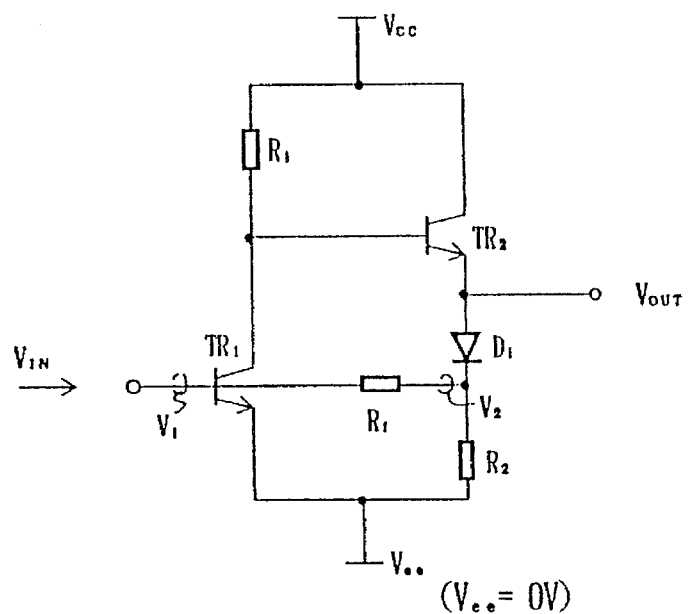
FIG. 28 is a diagram showing a structural example of a trans-impedance type preamplifier.

FIG. 26 shows other embodiment for further overcoming the problem of the oscillation at the time when the light-receipt system is mounted. In the diagram, reference numeral "192" is a box having conductivity of the light-receipt system. Numeral "20" is a mother board, and "21" is a reference ground pattern formed on the mother board.

The embodiment has a feature of having two parts structure having, at least, the bottom surface 192a of the box 192, of non-conductivity and other parts of conductivity. Therefore, it is prevented from forming the capacity C generated, as shown in FIG. 19, according to the gap between the bottom surface of the operation box 192 having conductivity and the reference ground pattern 21 on the mother board 20. Accordingly, it is prevented to form the resonant circuit 182 shown in FIG. 20 according to the embodiment of FIG. 26.

As explained according to the embodiments described above, improvements will be obtained according to the present invention, as follows.

At first, it becomes possible to makes the optimum multiplication factor $M_{OPT}$, at all times, for the light input power in comparison with the fixed bias system and the FULL-AGC system, so that the S/N can be further improved.

At second, the noize generated according to the increase of the multiplication factor at the time the light input is disconnected is not generated by making the maximum value of the multiplication factor M $M_{OPT}$ at the minimum light-receipt power, so that it becomes possible to detect the disconnection, easily, by detecting the peak on the output of a post-amplifier.

At third, the time constant of the control loop can be set easily, and independently to the main signal. At fourth, it becomes possible to make the compensation of temperature for the avalanche photo diode APD with a simple structure.

As mentioned above, an effective bias circuit of the avalanche photo diode APD is provided, so that the system according to the present invention contributes greatly.

Although the present invention has been explained according to the embodiment, the present invention is not limited to the above-described explanation. And it should of course be understood that those which are the same as the technical concept of the invention are within the protective scope of the present invention.

What is claimed is:

1. A light receipt system for use in optical digital communication comprising:
   a series circuit of a first bias resistor means and a light-receipt element having a cathode connected to said first bias resistor means;
   a preamplifier connected to the series circuit for converting a current corresponding to a level of an optical input which is detected by the light-receipt element to a corresponding voltage and outputting said corresponding voltage;
   a main amplifier for amplifying the corresponding voltage output from the preamplifier;
   an identifying and reproducing circuit for identifying the output of the main amplifier and reproducing data corresponding to said optical input; and
   a second bias resistor means having a larger value than an input impedance of the preamplifier and provided between the input of the preamplifier and the ground potential for flowing a bias current therethrough and increasing an input saturation current of the preamplifier.

2. The light-receipt system according to claim 1, further comprising a diode provided in series to the second bias resistor means inserted between the input of the preamplifier and the ground potential, whereby the value of the bias current is kept constant, for the temperature variation of an input direct current voltage of the preamplifier.

3. The light-receipt system according to claim 2, wherein a series connection of the second bias resistor means and the diode is inserted between the input of the preamplifier and the ground potential, so that the second bias resistor means is connected to the input terminal of the preamplifier.

4. The light-receipt system according to claim 1, wherein said first bias resistor means has a first resistor and a second resistor, said series circuit includes a series connection of the first and second resistors connected to a voltage source and the light-receipt element; and further comprising a bypass current path for controlling a current flowing to the series circuit so that the potential of a junction point between the first resistor and the second resistor is set to a predetermined value.

5. The light-receipt system according to claim 4, wherein said series circuit further includes a third resistor connected to the series connection of the first resistor and the second resistor,
the light-receipt element is connected between the second resistor and the third resistor, and
the bypass current path is connected to the junction point of the first resistor and the second resistor.

6. The light-receipt system according to claim 5, wherein the values of the first resistor, the second resistor, and the third resistor are determined so as to set a voltage by which the light-receipt element is not broken down, when a maximum rated current of the light-receipt element is flowed, and
the values of the first resistor and a bypass current flowing to the current path are determined so as that a multiplication factor of the light-receipt element can be controlled to be an optimum value, when a light-receipt power is minimum, with a potential at the junction point of the first resistor and the second resistor.

7. The light-receipt system according to claim 6, wherein the bypass current path varies the bypass current, and the potential at the junction point of the first resistor and the second resistor is varied, with descent of the voltage of the first resistor.

8. The light-receipt system according to claim 6, wherein the values of the second resistor and the third resistor are determined so as to make the multiplication factor optimum, for the light input power of the light-receipt element.

9. The light-receipt system according to claim 5, wherein said series connection of the first resistor and the second resistor is connected to the cathode of the light-receipt element, and
the third resistor is connected to an anode of the light-receipt element as a load resistor for the light-receipt element.

10. The light-receipt system according to claim 5, wherein the bypass current path has a first series connection of a control transistor and a fourth resistor, and a second series connection of a fifth resistor and a sixth resistor, which are respectively connected between the junction point of the first resistor and the second resistor and a terminal of the third resistor opposite to the light-receipt element, and an operational amplifier for comparing the voltage potential at the junction point of the second series connection of the fifth resistor and the sixth resistor with a first predetermined potential, making the impedance of the control transistor variable with the output, and controlling the bypass current.

11. The light-receipt system according to claim 10, further comprising:

an operational amplifier for comparing a voltage potential of a terminal of an element having a temperature inclination characteristic with a second predetermined voltage potential, and outputting the first predetermined potential.

12. The light-receipt system according to claim 1, wherein said first bias resistor means includes a first resistor and a second resistor; and further comprising:

a bias control loop section having a bypass current path for controlling a current flowing to the series circuit so as to maintain a voltage potential of a junction point of the first resistor and the second resistor at a predetermined value; and a temperature compensation section having a diode of the same temperature characteristic as that of the light-receipt element, for generating a control voltage corresponding to a temperature change of the diode to control a bypass current flowing in the bypass current path of the bias control loop section.

13. The light-receipt system according to claim 12; and further comprising an amplifying, identifying and reproducing section, a third resistor connected to the series circuit, and a voltage potential at two ends of the third resistor being inputted to the amplifying, identifying and reproducing section as a light-receipt output.

14. The light-receipt system according to claim 12, wherein the current flowing to the series circuit is inputted to the amplifying, identifying and reproducing section as a light-receipt output.

15. A light-receipt system for use in optical digital communication comprising:

a series circuit of a bias resistor and a light-receipt element having a cathode connected to the bias resistor;

a preamplifier connected to the series circuit for converting a current corresponding to a level of an optical input which is detected by the light-receipt element to a corresponding voltage and outputting said corresponding voltage;

a main amplifier for amplifying the corresponding voltage output from said preamplifier; and an identifying and reproducing circuit for identifying the output of the main amplifier and reproducing data corresponding to said optical input, the bias resistor being adjusted so as to be in a setting range, where a bias voltage of the light-receipt element at the maximum light input level can be controlled and determined from the dispersion characteristic of a self-bias control voltage of the light-receipt element.

16. The light-receipt system according to claim 15, wherein a setting value of the bias resistor is calculated based on a breakdown voltage of the light-receipt element obtained and data of a temperature inclination of the breakdown voltage, and the bias resistor having the setting value is assembled to the light-receipt system.

17. A light-receipt system for use in optical digital communication comprising:

a series circuit of a bias resistor and a light-receipt element having a cathode connected to the bias resistor;

a preamplifier connected to the series circuit for converting a current corresponding to a level of an optical input which is detected by the light-receipt element to a corresponding voltage and outputting said corresponding voltage;

a main amplifier for amplifying the corresponding voltage output from said preamplifier;

an identifying and reproducing circuit for identifying the output of the main amplifier and reproducing data corresponding to said optical input; and a diode connected in parallel to the bias resistor, a bias voltage of the light-receipt element at a maximum optical input level being clamped by a forward voltage of the diode.

18. A light receipt system for use in optical digital communication comprising:

a series circuit of a bias resistor and a light-receipt element having a cathode connected to the bias resistor;

a preamplifier connected to the series circuit for converting a current corresponding to a level of an optical input which is detected by the light-receipt element to a corresponding voltage and outputting said corresponding voltage;

a main amplifier for amplifying the output of the preamplifier;

an identifying and reproducing circuit for identifying the output of the main amplifier and reproducing data corresponding to said optical input; and a transistor connected to the bias resistor in parallel for operating with a fixed clamp voltage so as to clamp a cathode potential of the light-receipt element.

19. A light receipt system for use in optical digital communication comprising:

a series circuit of a bias resistor and a light-receipt element having a cathode connected to the bias resistor;

a preamplifier connected to the series circuit for converting a current corresponding to a level of an optical input which is detected by the light-receipt element to a corresponding voltage and outputting said corresponding voltage;

a main amplifier for amplifying the output of the preamplifier;

an identifying and reproducing circuit for identifying the output of the main amplifier and reproducing data corresponding to said optical input;

a casing for a light-receipt system of conductivity having a reference ground potential, and a printed circuit board on which the preamplifier and the main amplifier connected in cascade with the preamplifier are mounted, said casing having a bottom surface and a plurality of conductive pins, which stand on the bottom surface, and said printed circuit board having a ground pattern connecting an input-load resistor and an output-load resistor of the preamplifier and the main amplifier connected in cascade with the preamplifier, wherein the ground pattern is connected in parallel to the plurality of pins when the printed circuit board is stored in the casing.

20. The light-receipt system according to claim 19,
wherein the ground pattern connecting the input-load resistor and the output-load resistor of the preamplifier and the main amplifier which are connected in cascade is divided into a plurality of patterns, and each of the divided patterns is connected to each of the plurality of conductive pins.

21. A light-receipt system for use in optical digital communication mounted on a mother board having a ground pattern comprising:

a series circuit of a bias resistor and a light-receipt element having a cathode connected to the bias resistor;

a preamplifier connected to the series circuit for converting a current corresponding to a level of an optical input which is detected by the light-receipt element to a corresponding voltage output from the preamplifier;

a main amplifier for amplifying the output of the preamplifier;

an identifying and reproducing circuit for identifying the output of the main amplifier and reproducing data corresponding to the optical input;

a casing of conductivity having a reference ground potential;

a printed circuit board stored in the casing on which the preamplifier and the main amplifier connected in cascade with the preamplifier are mounted, said printed circuit board having a ground pattern formed between an input-load resistor and an output-load resistor of the preamplifier and the main amplifier and a power source of the preamplifier and the main amplifier; and an interface pin for connecting the ground pattern, the ground pattern on the mother board, the ground pattern between the input-load resistor and the output-load resistor of the preamplifier and the main amplifier and the power source of the preamplifier and the main amplifier, the casing including cut portions electrically connected to the interface pin.

22. A light-receipt system for use in optical digital communication mounted on a mother board having a ground pattern comprising:

a series circuit of a bias resistor and a light-receipt element having a cathode connected to the bias resistor;

a preamplifier connected to the series circuit for converting a current corresponding to a level of an optical input which is detected by the light-receipt element to corresponding voltage to output said corresponding voltage;

a main amplifier for amplifying the output of the preamplifier;

an identifying and reproducing circuit for identifying the output of the main amplifier and reproducing data corresponding to said optical input;

a casing of a reference ground potential, having at least a non-conductive bottom surface; and a printed circuit board stored in the casing, on which the preamplifier and the main amplifier connected in cascade with the preamplifier are mounted, said printed circuit board having a ground pattern formed for connecting an input-load resistor and an output-load resistor of the preamplifier and the main amplifier and a power source of the preamplifier and the main amplifier, wherein the non-conductive bottom surface of the casing is arranged so as to face to the ground pattern of the casing.

* * * * *